US012568682B2

(12) United States Patent (10) Patent No.: US 12,568,682 B2
Hafez et al. (45) Date of Patent: Mar. 3, 2026

(54) NANORIBBON THICK GATE DEVICE WITH HYBRID DIELECTRIC TUNING FOR HIGH BREAKDOWN AND VT MODULATION

(71) Applicant: Intel Corporation, Santa Clara, CA (US)

(72) Inventors: Walid M. Hafez, Portland, OR (US); Rahul Ramaswamy, Portland, OR (US); Tanuj Trivedi, Hillsboro, OR (US); Jeong Dong Kim, Scappoose, OR (US); Ting Chang, Portland, OR (US); Babak Fallahazad, Portland, OR (US); Hsu-Yu Chang, Hillsboro, OR (US); Nidhi Nidhi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 1159 days.

(21) Appl. No.: 16/713,703

(22) Filed: Dec. 13, 2019

(65) Prior Publication Data

US 2021/0183857 A1 Jun. 17, 2021

(51) Int. Cl.
*H10D 84/85* (2025.01)
*H01L 21/02* (2006.01)
(Continued)

(52) U.S. Cl.
CPC ..... *H10D 84/853* (2025.01); *H01L 21/02337* (2013.01); *H10D 30/6735* (2025.01); *H10D 30/6757* (2025.01); *H10D 64/685* (2025.01)

(58) Field of Classification Search
CPC ....... H01L 21/02337; H01L 21/823857; H01L 21/823807; H01L 21/823828;
(Continued)

(56) References Cited

U.S. PATENT DOCUMENTS 9,922,885 B1 * 3/2018 Moriwaki ............. H01L 27/092
2020/0168715 A1 * 5/2020 Wu ........................ H01L 27/088
(Continued)

OTHER PUBLICATIONS

Tanuj Trivedi, et al., "Nanoribbon Thick Gate Devices With Differential Ribbon Spacing and Width for SOC Applications" U.S. Appl. No. 16/713,684 filed Dec. 13, 2019, 71 pages.
(Continued)

*Primary Examiner* — David Vu
(74) *Attorney, Agent, or Firm* — Schwabe, Williamson & Wyatt P.C.

(57) ABSTRACT

Embodiments disclosed herein include semiconductor devices and methods of forming such semiconductor devices. In an embodiment, the semiconductor device comprises a substrate, and a first transistor over the substrate. In an embodiment, the first transistor comprises a first semiconductor channel above the substrate, a first gate dielectric surrounding the first semiconductor channel, and a first gate electrode over the first gate dielectric. In an embodiment, the semiconductor device further comprises a second transistor over the substrate. In an embodiment, the second transistor comprises a second semiconductor channel above the substrate, a second gate dielectric surrounding the second semiconductor channel, where the second gate dielectric is different than the first gate dielectric, and a second gate electrode over the second gate dielectric, where the first gate electrode and the second gate electrode comprise the same material.

20 Claims, 20 Drawing Sheets

(51) Int. Cl.
    *H10D 30/67*       (2025.01)
    *H10D 64/68*       (2025.01)

(58) Field of Classification Search
    CPC .......................... H01L 21/76801–76837; H01L 21/02601–02606; H01L 21/3142; H01L 21/28185; H01L 21/02126; H01L 21/0214; H01L 21/02142; H01L 21/0217; H01L 21/02172; H01L 21/02219; H01L 21/02247–02249; H01L 21/02389; H01L 21/02458; H01L 21/0254; H01L 21/02614; H01L 21/28202; H01L 21/3143–3145; H01L 21/318; H01L 21/3185; H01L 21/3211; H01L 21/76856; H01L 21/823431; H01L 21/823821; H01L 21/845; H01L 27/0924; H01L 27/124; H01L 27/0922; H01L 27/1211; H01L 27/0886; H01L 27/10826; H01L 27/10879; H01L 29/42392; H01L 29/513; H01L 29/78696; H01L 29/66545; H01L 29/0673; H01L 29/0669–068; H01L 29/413; H01L 29/785; H01L 29/66795–66818; H01L 29/7855–7856; H01L 29/41791; H01L 31/035227; H01L 51/426; H01L 51/4266; H01L 51/502; H01L 2221/1005–1063; H01L 2221/1094; H01L 2924/10325; H01L 2924/13086; H01L 2924/13088; H01L 2029/7858; H01L 2924/13067; Y10S 977/755–777; Y10S 977/72–722; Y10S 977/854; Y10S 977/813–826; Y10S 977/938
    See application file for complete search history.

(56)         References Cited

U.S. PATENT DOCUMENTS

| | | | |
|---|---|---|---|
| 2021/0036144 A1* | 2/2021 | Liaw | H01L 29/66439 |
| 2021/0098457 A1* | 4/2021 | Cheng | H01L 21/823821 |

OTHER PUBLICATIONS

Office Action from Korean Patent Application No. 10-2020-0124458, mailed Oct. 31, 2025, 4 pgs.

* cited by examiner

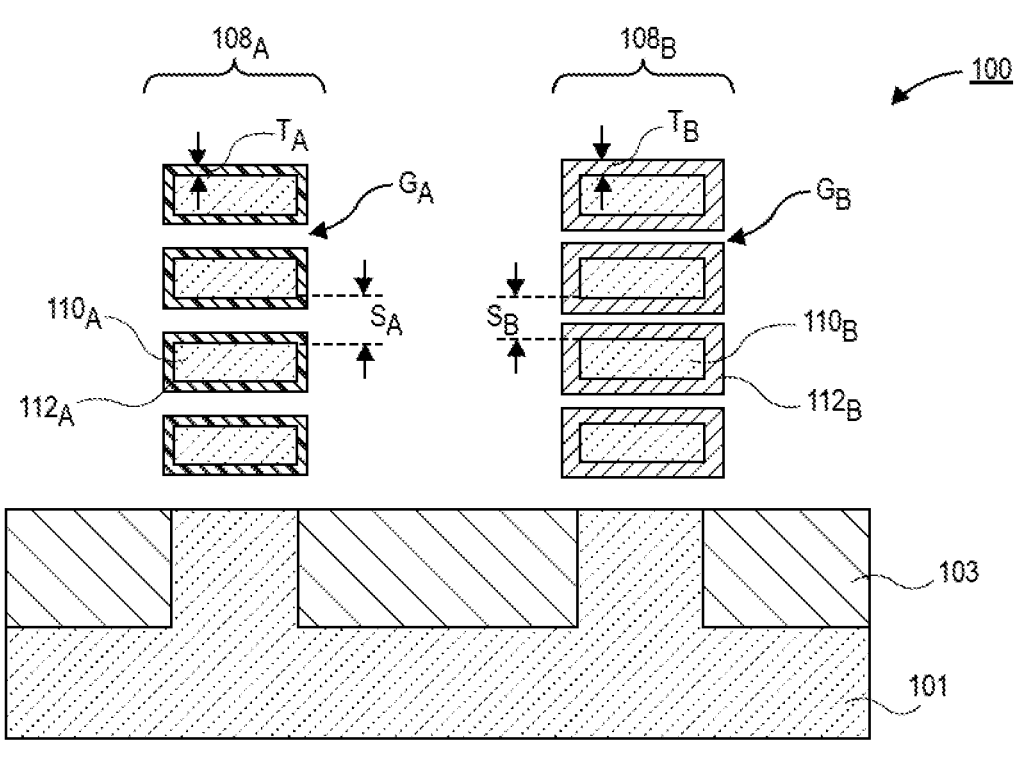
FIG. 1A
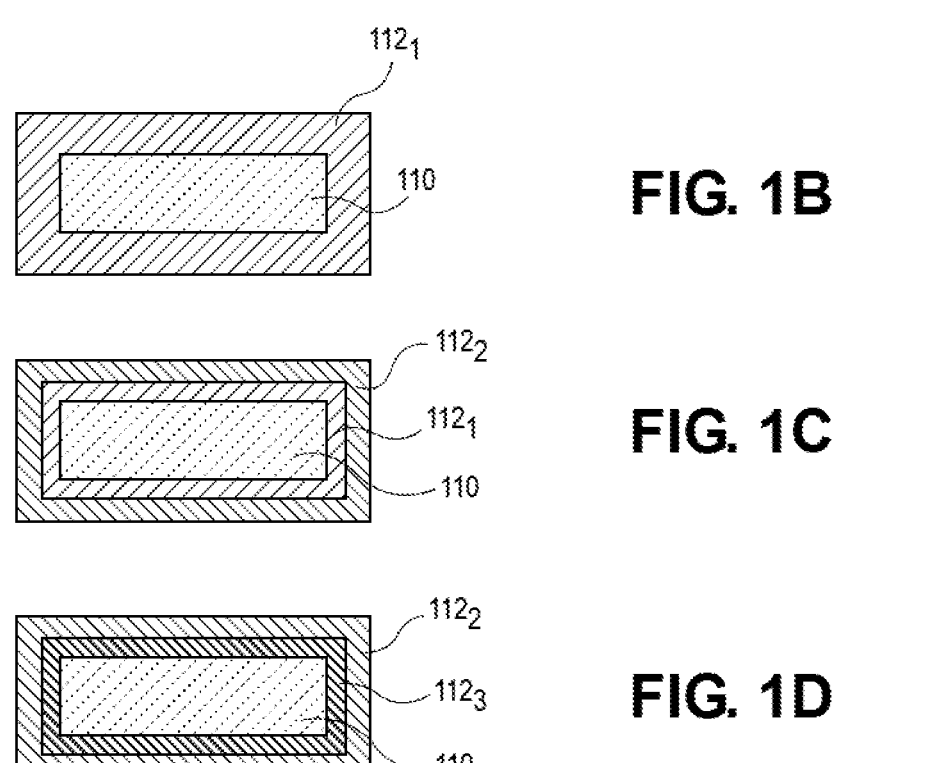
FIG. 1B
FIG. 1C
FIG. 1D

NANORIBBON THICK GATE DEVICE WITH HYBRID DIELECTRIC TUNING FOR HIGH BREAKDOWN AND VT MODULATION

TECHNICAL FIELD

Embodiments of the present disclosure relate to semiconductor devices, and more particularly to thick gate nanoribbon devices with hybrid gate dielectrics for high breakdown and VT modulation.

BACKGROUND

As integrated device manufacturers continue to shrink the feature sizes of transistor devices to achieve greater circuit density and higher performance, there is a need to manage transistor drive currents while reducing short-channel effects, parasitic capacitance, and off-state leakage in next-generation devices. Non-planar transistors, such as fin and nanowire-based devices, enable improved control of short channel effects. For example, in nanowire-based transistors the gate stack wraps around the full perimeter of the nanowire, enabling fuller depletion in the channel region, and reducing short-channel effects due to steeper sub-threshold current swing (SS) and smaller drain induced barrier lowering (DIBL).

Different functional blocks within a die may need optimization for different electrical parameters. In some instances high voltage transistors for power applications need to be implemented in conjunction with high speed transistors for logic applications. High voltage transistors typically suffer from high leakage current. Accordingly, high voltage applications typically rely on fin-based transistors. Fin-based transistors allow thicker gate oxides compared to nanowire devices. In nanowire devices, a thicker oxide results in the space between nanowires being reduced to the point that little or no gate metal can be disposed between the nanowires.

BRIEF DESCRIPTION OF THE DRAWINGS

FIG. 1A is a cross-sectional illustration of a stack of nanoribbons for a high-speed transistor and a stack of nanoribbons for a high-voltage transistor, in accordance with an embodiment.

FIGS. 1B-1D are cross-sectional illustrations of various gate dielectric configurations for high-voltage transistors, in accordance with an embodiment.

EMBODIMENTS OF THE PRESENT DISCLOSURE

Figure 2A:
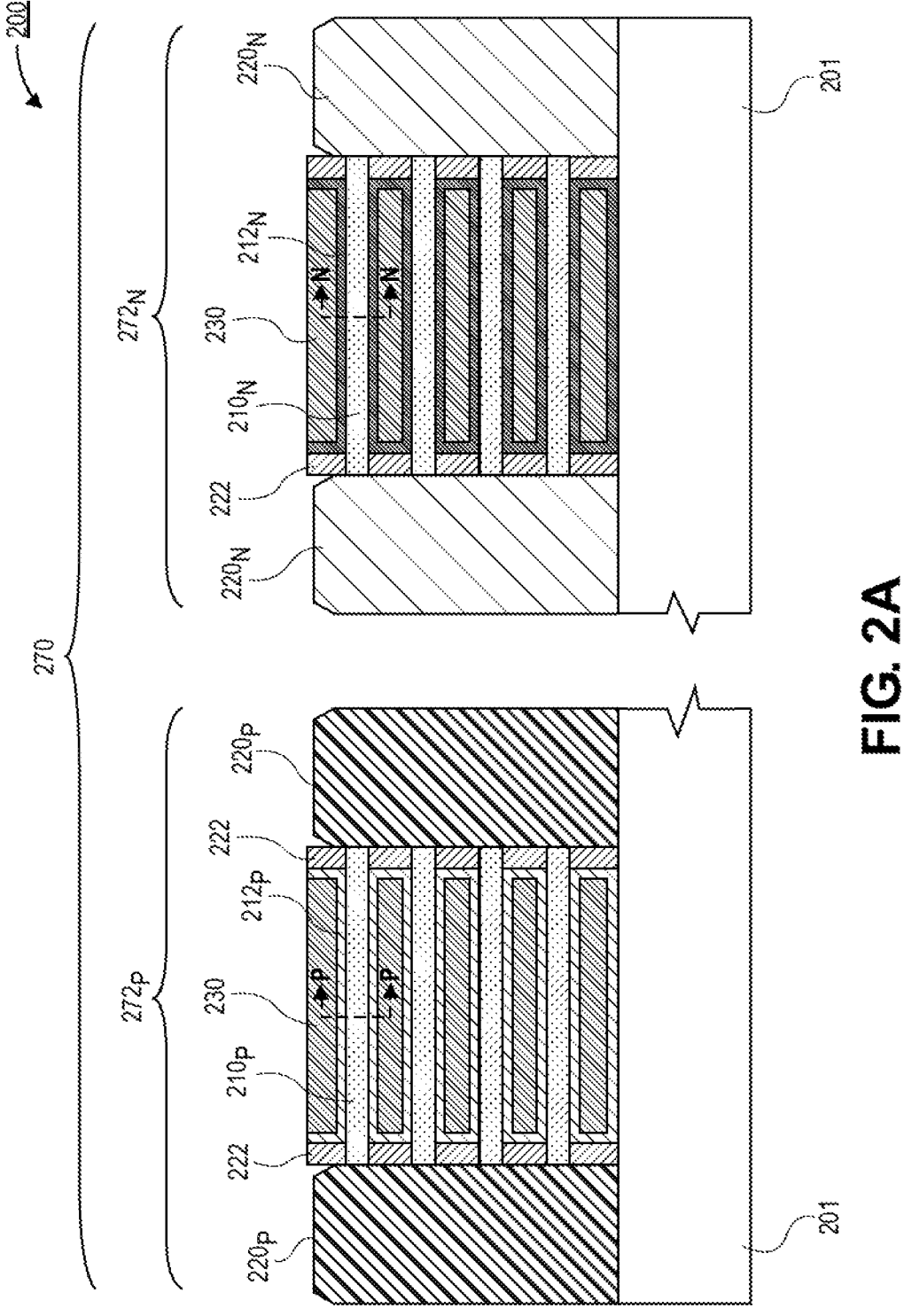
FIG. 2A is a cross-sectional illustration of a P-type nanoribbon transistor and an N-type nanoribbon transistor that include gate electrodes with the same work function metal, in accordance with an embodiment.

Described herein are thick gate nanoribbon devices with hybrid gate dielectrics for high breakdown and VT modulation, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

Nanoribbon devices are described in greater detail below. However, it is to be appreciated that substantially similar devices may be formed with nanowire channels. A nanowire device may include devices where the channel has a width dimension and a thickness dimension that are substantially similar, whereas a nanoribbon device may include a channel that has a width dimension that is substantially larger or substantially smaller than a thickness dimension. As used herein, "high-voltage" may refer to voltages of approximately 1.0V or higher.

In current processes for forming nanoribbon transistors, the spacing between the nanoribbons is driven by logic performance. For logic devices, the spacing is minimized in order to reduce capacitance, which negatively affects the switching speed. However, transistors for high-voltage applications, require thicker gate dielectrics. The increase in the dielectric thickness is not compatible with the narrow spacing needed for logic devices. As noted above, the thick gate dielectrics pinch off the area between the nanoribbons and prevent gate metal from completely surrounding the nanoribbons.

Additionally, threshold voltage (VT) tuning needed to provide efficient N-type and P-type transistors for high-voltage is difficult to implement with thick gate dielectric devices. Typically, the VT tuning is implemented by disposing different work function metals for the P-type device and the N-type device. For example, a P-type work function metal is disposed over both channel types, and the P-type work function metal is subsequently removed from the N-type channel region with an etching process. However, due to the narrow spacing due to the thick gate dielectric, slivers or other portions of the first work function metal may not be entirely cleared from the N-type channel region. This results in a decrease in the maximum voltage (V MAX) of the N-type transistor.

Accordingly, embodiments disclosed herein provide gate dielectric configurations for high-voltage P-type and N-type transistors to address one or more of the issues above without needing to increase the spacing between nanoribbons. In an embodiment, the thickness of the gate dielectric in the high-voltage transistors may be reduced by providing a gate dielectric with a higher dielectric constant (k). A higher dielectric constant (k) may be provided using a multi-layer configuration. For example, a first layer comprising a standard gate dielectric (e.g., $SiO_2$ or $HfO_2$) may surround the nanoribbon, and a second layer comprising a dipole material may surround the first layer. Dipole materials, such as those described below, have significantly high dielectric constants (k) than the first layer and allow for a thinner overall dielectric thickness.

In other embodiments, the high-voltage P-type transistor and N-type transistor may also include the same work function metal. As such, there is no chance for residual portions of a non-compatible metal being left behind to decrease the V MAX. Instead of modulating the VT with the work function metal, embodiments disclosed herein include modulating the VT with the gate dielectric material. In one embodiment, various anneal treatments of the gate dielectric may increase or decrease the VT to provide the desired functionality for the P-type and N-type transistors. In other embodiments, the choice of material (e.g., various dipole materials) for the gate dielectric may be used to modulate the VT. For example, the VT of the P-type transistors may be increased, and the VT of the N-type transistors may be decreased.

Referring now to FIG. 1A, a cross-sectional illustration of an electronic device 100 is shown, in accordance with an embodiment. In an embodiment, the electronic device 100 is formed on a substrate 101. The substrate 101 may include a semiconductor substrate and an isolation layer 103 over the semiconductor substrate 101. In an embodiment, an underlying semiconductor substrate 101 represents a general workpiece object used to manufacture integrated circuits. The semiconductor substrate 101 often includes a wafer or other piece of silicon or another semiconductor material. Suitable semiconductor substrates 101 include, but are not limited to, single crystal silicon, polycrystalline silicon and silicon on insulator (SOI), as well as similar substrates formed of other semiconductor materials, such as substrates including germanium, carbon, or group III-V materials.

The cross-sectional illustration of FIG. 1A is along the channel region of a pair of transistors. A first channel 108$_A$ may comprise a vertically oriented stack of first nanoribbons 110$_A$, and a second channel 108$_B$ may comprise a vertically oriented stack of second nanoribbons 110$_B$. The first channel 108$_A$ may be part of a high-speed transistor (e.g., a transistor for logic applications), and the second channel 108$_B$ may be part of a high-voltage transistor (e.g., a transistor for power applications).

In the illustrated embodiment, the nanoribbons 110 are shown as floating. However, it is to be appreciated that the nanoribbons 110 may be secured into and out of the plane of FIG. 1A (e.g., by source/drain regions, gate spacers, etc.). In FIG. 1A the gate electrode around the first nanoribbons 110$_A$ and the second nanoribbons 110$_B$ is omitted for clarity. The nanoribbons 110 may comprise any suitable semiconductor materials. For example, the nanoribbons 110 may comprise silicon or group III-V materials.

In an embodiment, the dimensions and spacing of the first nanoribbons 110$_A$ may be substantially similar to the dimensions and spacing of the second nanoribbons 110$_B$. For example, the first nanoribbons 110$_A$ may have a first spacing $S_A$ and the second nanoribbons 110$_B$ may have a second spacing $S_B$ that is substantially equal to the first spacing $S_A$. In an embodiment, the first spacing $S_A$ may be approximately 10 nm or less. In an embodiment, the first nanoribbons 110$_A$ are aligned (in the Z-plane) with the second nanoribbons 110$_B$.

In an embodiment, the first nanoribbons 110$_A$ are each surrounded by a first gate dielectric 112$_A$, and the second nanoribbons 110$_B$ are each surrounded by a second gate dielectric 112$_B$. In some embodiments, the first gate dielectric 112$_A$ has a first thickness $T_A$ and the second gate dielectric 112$_B$ has a second thickness $T_B$. In an embodiment, the first thickness $T_A$ is smaller than the second thickness $T_B$. For example, the first thickness $T_A$ may be approximately 3 nm or less and the second thickness $T_B$ may be approximately 3 nm or greater. In an embodiment, the first gate dielectric 112$_A$ and the second gate dielectric 112$_B$ may be different materials. For example, the first gate dielectric 112$_A$ and the second gate dielectric 112$_B$ may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Due to the difference between the first thickness $T_A$ and the second thickness $T_B$, the gaps between the dielectric materials 112 may be different. For example, the first dielectrics 112$_A$ may have a first gap $G_A$ between neighboring surfaces of the first dielectrics 112$_A$, and the second dielectrics 112$_B$ may have a second gap $G_B$ between neighboring surfaces of the second dielectrics 112$_B$. In order to prevent pinching between the second gate dielectrics 112$_B$ and completely closing the second gap $G_B$, the second gate dielectrics 112$_B$ may have various dielectric configurations. The various configurations allow for a higher dielectric constant (k) and allow for a second thickness $T_B$ to be decreased while still being able to support high voltages. In some embodiments, the higher dielectric constant (k) allows for the second thickness $T_B$ may be decreased so that the second thickness $T_B$ is approximately equal to the first thickness $T_A$.

Referring now to FIGS. 1B-1D, various configurations for the second gate dielectric 112 around a nanoribbon 110 are shown, in accordance with an embodiment. In FIG. 1B, a first gate dielectric layer 112$_1$ is shown. The first gate dielectric layer 112$_1$ may comprise an oxide, such as $SiO_2$. In an embodiment, the first gate dielectric layer 112$_1$ may be deposited (e.g., with atomic layer deposition (ALD)) or grown (e.g., with an oxidation process). In some embodiments, the first gate dielectric layer 112$_1$ may be annealed to improve the dielectric constant (k). Suitable annealing processes are described in greater detail below.

In FIG. 1C, a first gate dielectric 112$_1$ is around the nanoribbon 110, and a second gate dielectric 112$_2$ is around the first gate dielectric 112$_1$. In an embodiment, the first gate dielectric $112_1$ may be $SiO_2$ and the second gate dielectric $112_2$ may be a dipole material. Dipole materials may have significantly higher dielectric constant (k) than the $SiO_2$. For example, the dielectric constant (k) of $SiO_2$ may be approximately 3.9, and the dielectric constant (k) of the second gate dielectric $112_2$ may be approximately 10 or higher. Embodiments may include dipole materials such as, but not limited to, $La_2O_3$, $ZrO_2$, $Y_2O_3$, and $TiO_2$. In an embodiment, one or both of the first gate dielectric $112_1$ and the second gate dielectric $112_2$ may be annealed.

In FIG. 1D, a third gate dielectric $112_3$ is around the nanoribbon 110, and a second gate dielectric $112_2$ is around the third gate dielectric $112_3$. For example, the third gate dielectric $112_3$ may be $HfO_2$ and the second gate dielectric $112_2$ may be a dipole material. $HfO_2$ has a higher dielectric constant (k) than $SiO_2$. In FIGS. 1C and 1D, the first gate dielectric layer $112_1$ and the third gate dielectric $112_3$ provide an interfacial (buffer) layer between the dipole material of the second gate dielectric $112_2$ and the nanoribbon 110. Particularly, the first gate dielectric layer $112_1$ and the third gate dielectric layer $112_3$ may comprise materials with known good interfacial properties with respect to the nanoribbon 110 material (e.g., silicon). Accordingly, reliability of the hybrid gate dielectric is still high.

Referring now to FIG. 2A, a cross-sectional illustration of a high-voltage region 270 of an electronic device 200 is shown, in accordance with an embodiment. In an embodiment, the high-voltage region 270 comprises a P-type transistor $272_P$ and an N-type transistor $272_N$. The P-type transistors $272_P$ and the N-type transistor $272_N$ are both gate all around (GAA) transistors. That is, the gate dielectrics $212_P$ and $212_N$ and the gate electrode 230 wrap entirely around an outer surface of the respective semiconductor channels (e.g., nanoribbon channels $210_P$ and $210_N$). The transistors $272_P$ and $272_N$ are disposed over a substrate 201. The transistors 272 each comprises a plurality of vertically stacked nanoribbons $210_N$ or $210_P$. The nanoribbons 210 may be substantially similar to the nanoribbons 110 described above.

Source/drains 220 are positioned on opposite ends of each stack of nanoribbons 210. For example, P-type source/drain regions $220_P$ are on opposite ends of the nanoribbons $210_P$, and N-type source/drain regions $220_N$ are on opposite ends of the nanoribbons $210_N$. In an embodiment, the source/drain regions 220 may comprise an epitaxially grown semiconductor material. The source/drain regions 220 may comprise a silicon alloy. In some implementations, the source/drain regions 220 comprise a silicon alloy that may be in-situ doped silicon germanium, in-situ doped silicon carbide, or in-situ doped silicon. In alternate implementations, other silicon alloys may be used. For instance, alternate silicon alloy materials that may be used include, but are not limited to, nickel silicide, titanium silicide, cobalt silicide, and possibly may be doped with one or more of boron and/or aluminum. In other embodiments, the source/drain regions 220 may comprise alternative semiconductor materials (e.g., semiconductors comprising group III-V elements and alloys thereof) or conductive materials.

In an embodiment, the nanoribbons 210 may pass through spacers 222. The spacers 222 define the channel region. That is, the channel region may refer to the region of the nanoribbons 210 between interior surfaces of opposing spacers 222. In an embodiment, a gate structure may cover the channel region of the nanoribbons 210. The gate structure may comprise a gate dielectric 212 and a gate electrode 230. In an embodiment, the gate electrode 230 of the P-type transistor $272_P$ comprises the same material as the gate electrode 230 of the N-type transistor $272_N$. That is, the work function of the gate electrode 230 for the P-type transistor $272_P$ is the same as the work function of the gate electrode 230 for the N-type transistor $272_N$. For example, the work function metal may include, but is not limited to, hafnium, zirconium, titanium, tantalum, aluminum, and metal carbides that include these elements, e.g., titanium carbide, zirconium carbide, tantalum carbide, hafnium carbide, aluminum carbide, ruthenium, palladium, platinum, cobalt, nickel, and conductive metal oxides, e.g., ruthenium oxide. In some embodiments, the gate electrode 230 may also comprise a workfunction metal and a fill metal (e.g., tungsten) over the workfunction metal.

Since the work function metal of the gate electrode 230 is the same for the P-type transistor $272_P$ and the N-type transistor $272_N$, the VT is modulated by the gate dielectrics 212. Accordingly, the P-type gate dielectric $212_P$ is different than the N-type gate dielectric $212_N$. In a particular embodiment, the P-type gate dielectric $212_P$ provides a relative increase to the VT and the N-type gate dielectric $212_N$ provides a relative decrease to the VT. As such, there is no need to have different metals for the gate electrodes. Defects due to failure to completely remove a first metal before depositing the second metal is avoided completely. The removal of such defects provides a high V MAX and high reliability.

As shown, the gate dielectrics $212_P$ and $212_N$ are conformally deposited. That is the gate dielectrics $212_P$ and $212_N$ completely wrap around the respective nanoribbons $210_P$ and $210_N$, as well as depositing along interior surfaces of the spacers 222 and the surface of the substrate 201. In other embodiments, one or both of the gate dielectrics $212_P$ and $212_N$ are formed with an oxidation process. In such embodiments, the grown gate dielectric $212_P$ and/or $212_N$ may only be present over the nanoribbons 210. That is, the gate electrode 230 may directly contact the spacers 222.

In an embodiment, the VT tuning may be implemented by treatment of the gate dielectrics 212 and/or by material selection. In one embodiment, one or both of the gate dielectrics $212_P$ and $212_N$ may be annealed after being formed. In a particular embodiment, an anneal in an $NH_3$ ambient may be used to increase the VT (for P-type gate dielectrics $212_P$) or decrease the VT (for N-type gate dielectrics $212_N$). In an embodiment, the presence of nitrogen at the surface of the gate dielectrics $212_P$ and/or $212_N$ can be used to confirm that such an annealing process was used to modulate the VT of the transistors $272_P$ and/or $272_N$. For example, analytical techniques such as, but not limited to, SIMS may be used to confirm that the gate dielectrics $212_P$ and/or $212_N$ comprise nitrogen. Typically, nitrogen would not be present in the formation of oxide based dielectric materials, such as $SiO_2$ or $HfO_2$.

In an embodiment, annealing processes may be implemented at temperatures between approximately 400° C. and approximately 1,000° C. with durations between approximately 5 minutes and approximately 30 minutes. In an embodiment, the P-type anneal and the P-type anneal may have uniform annealing treatments or the annealing treatments may differ. For some annealing treatments (e.g., with an ammonia ambient) a charge is induced in the gate stack and results in a shift of the N-type VT more negative and an increase in the P-type VT. The difference in VT may result from the way the charge alters the band diagram of the devices, allowing one to turn on faster than the other. In some embodiments, the N-type VT may shift more negative up to approximately 100 mV and the P-type VT may increase by approximately 50 mV to approximately 70 mV.

In other embodiments, the VT is modulated by selecting different materials for the P-type gate dielectric $212_P$ and the N-type gate dielectric $212_N$. For example, combinations of different oxides and/or different dipole materials, similar to the dielectric configurations described with respect to FIGS. 1B-1D, may be used to modulate the VT. Examples of different combinations are provide below with respect to FIGS. 2B-2G.

Figure 2B:
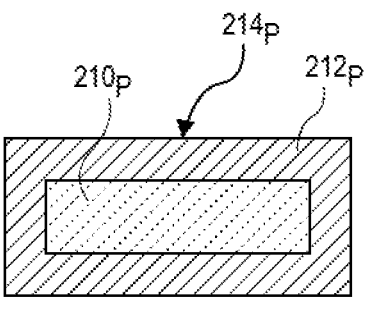
FIGS. 2B-2G are cross-sectional illustrations of P-type nanoribbons and N-type nanoribbons with different gate dielectric configurations, in accordance with an embodiment.
Figure 2B:
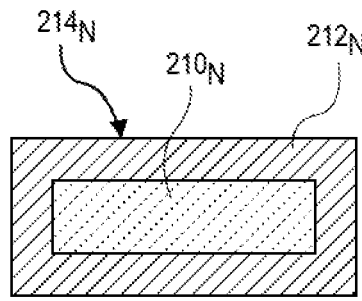

Referring now to FIG. 2B, a cross-sectional illustration of a P-type nanoribbon $210_P$ and an N-type nanoribbon $210_N$ in high-voltage transistors is shown, in accordance with an embodiment. As shown, the P-type gate dielectric $212_P$ has the same shading as the N-type gate dielectric $212_N$. That is, the P-type gate dielectric $212_P$ and the N-type gate dielectric $212_N$ may comprise the same base material (e.g., $SiO_2$ or $HfO_2$). In an embodiment, the two gate dielectrics $212_P$ and $212_N$ differ in that they may have different treatments. For example, an anneal of the P-type gate dielectric $212_P$ is different than an anneal of the N-type gate dielectric $212_N$. In an embodiment, the difference between the two gate dielectrics $212_P$ and $212_N$ may be determined by analysis of the surfaces $214_P$ and $214_N$. For example, a nitrogen concentration of the P-type surface $214_P$ may be different than a nitrogen concentration of the N-type surface $214_N$.

Figure 2C:
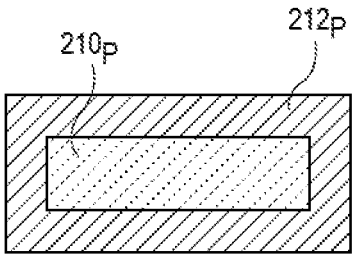
Figure 2C:
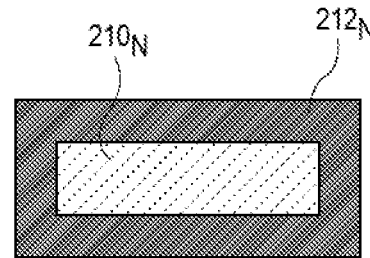

Referring now to FIG. 2C, a cross-sectional illustration of a P-type nanoribbon $210_P$ and an N-type nanoribbon $210_N$ in high-voltage transistors is shown, in accordance with an additional embodiment. As indicated by the different shading, the P-type gate dielectric $212_P$ may be a different material than the N-type gate dielectric $212_N$. For example, the P-type gate dielectric $212_P$ may be $SiO_2$ and the N-type gate dielectric $212_N$ may be $HfO_2$. In an embodiment, one or both of the P-type gate dielectric $212_P$ and the N-type gate dielectric $212_N$ may be treated (e.g., with an annealing process).

Figure 2D:
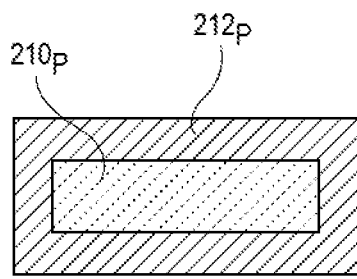
Figure 2D:
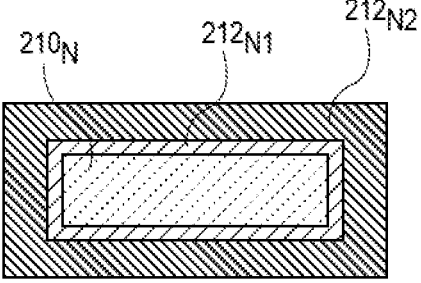

Referring now to FIG. 2D, a cross-sectional illustration of a P-type nanoribbon $210_P$ and an N-type nanoribbon $210_N$ in high-voltage transistors is shown, in accordance with an additional embodiment. As shown, one of the gate dielectrics may be a single material and the second of the gate dielectrics may be a hybrid dielectric. For example, the P-type gate dielectric $212_P$ comprises a single material layer, and the N-type gate dielectric $212_N$ comprises a first layer $212_{N1}$ and a second layer $212_{N2}$. The hybrid gate dielectric may comprise an oxide first layer $212_{N1}$ (e.g., $SiO_2$ or $HfO_2$), and the second layer $212_{N2}$ may comprise a dipole material (e.g., one or more of $La_2O_3$, $ZrO_2$, $Y_2O_3$, and $TiO_2$).

Figure 2E:
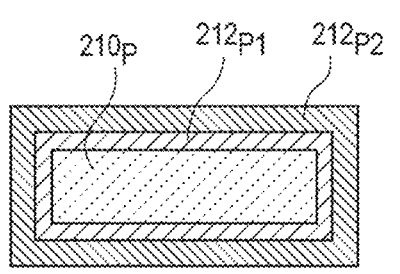
Figure 2E:
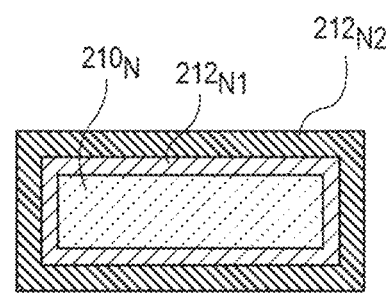

Referring now to FIG. 2E, a cross-sectional illustration of a P-type nanoribbon $210_P$ and an N-type nanoribbon $210_N$ in high-voltage transistors is shown, in accordance with an additional embodiment. As show, the gate dielectric over the P-type nanoribbon $210_P$ and the gate dielectric over the N-type nanoribbon $210_N$ are hybrid gate dielectrics. For example, the P-type gate dielectric comprises a first layer $212_{P1}$ and a second layer $212_{P2}$, and the N-type gate dielectric comprises a first layer $212_{N1}$ and a second layer $212_{N2}$. In an embodiment, the first layers $212_{P1}$ and $212_{N1}$ may be the same material. For example, the first layers $212_{P1}$ and $212_{N1}$ may be $SiO_2$ or $HfO_2$. In an embodiment, the second layers $212_{P2}$ and $212_{N2}$ may be different dipole materials.

Figure 2F:
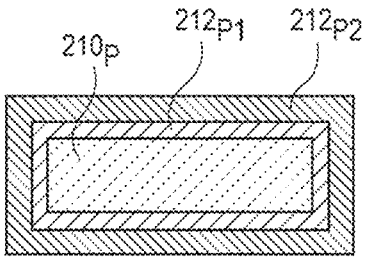
Figure 2F:
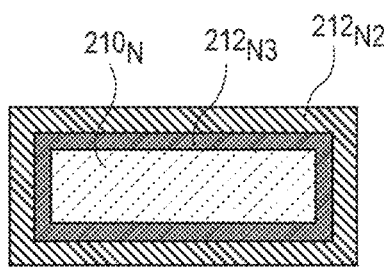

Referring now to FIG. 2F, a cross-sectional illustration of a P-type nanoribbon $210_P$ and an N-type nanoribbon $210_N$ in high-voltage transistors is shown, in accordance with an additional embodiment. The gate dielectrics in FIG. 2F may be similar to those in FIG. 2E, with the exception that the first layers $212_{P1}$ and $212_{N1}$ are not the same material. For example, one of the first layers $212_{P1}$ or $212_{N1}$ may comprise $SiO_2$, and the other first layer $212_{P1}$ or $212_{N1}$ may comprise $HfO_2$.

Figure 2G:
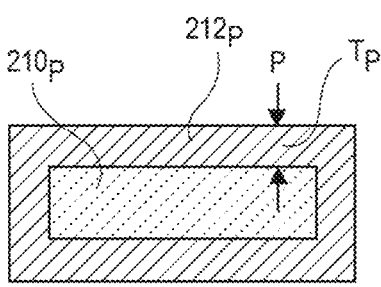
Figure 2G:
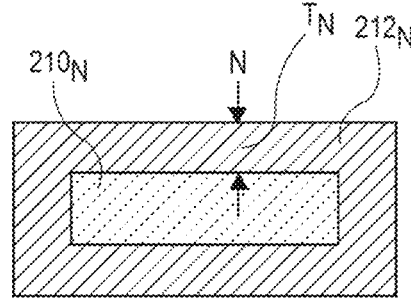

In FIGS. 2B-2G, the total thicknesses of the P-type gate dielectric and the total thickness of the N-type gate dielectric are shown as being substantially similar. However, it is to be appreciated that in some embodiments, the P-type gate dielectric and the N-type gate dielectric may have different thickness. Such an embodiment is shown in FIG. 2G. As shown, the P-type gate dielectric $212_P$ has a first thickness $T_P$, and the N-type gate dielectric $212_N$ has a second thickness $T_N$ that is greater than the first thickness $T_P$. In FIG. 2G, the P-type gate dielectric $212_P$ and the N-type gate dielectric $212_N$ are each shown as a single layer of dielectric material. However, it is to be appreciated that embodiments may also include non-uniform thicknesses when one or both of the P-type gate dielectric $212_P$ and the N-type gate dielectric $212_N$ are hybrid gate dielectrics.

Referring now to FIGS. 3A-3G, a series of cross-sectional illustrations depicting a process for forming variable gate dielectrics for high-voltage transistors is shown, in accordance with an embodiment.

Figure 3A:
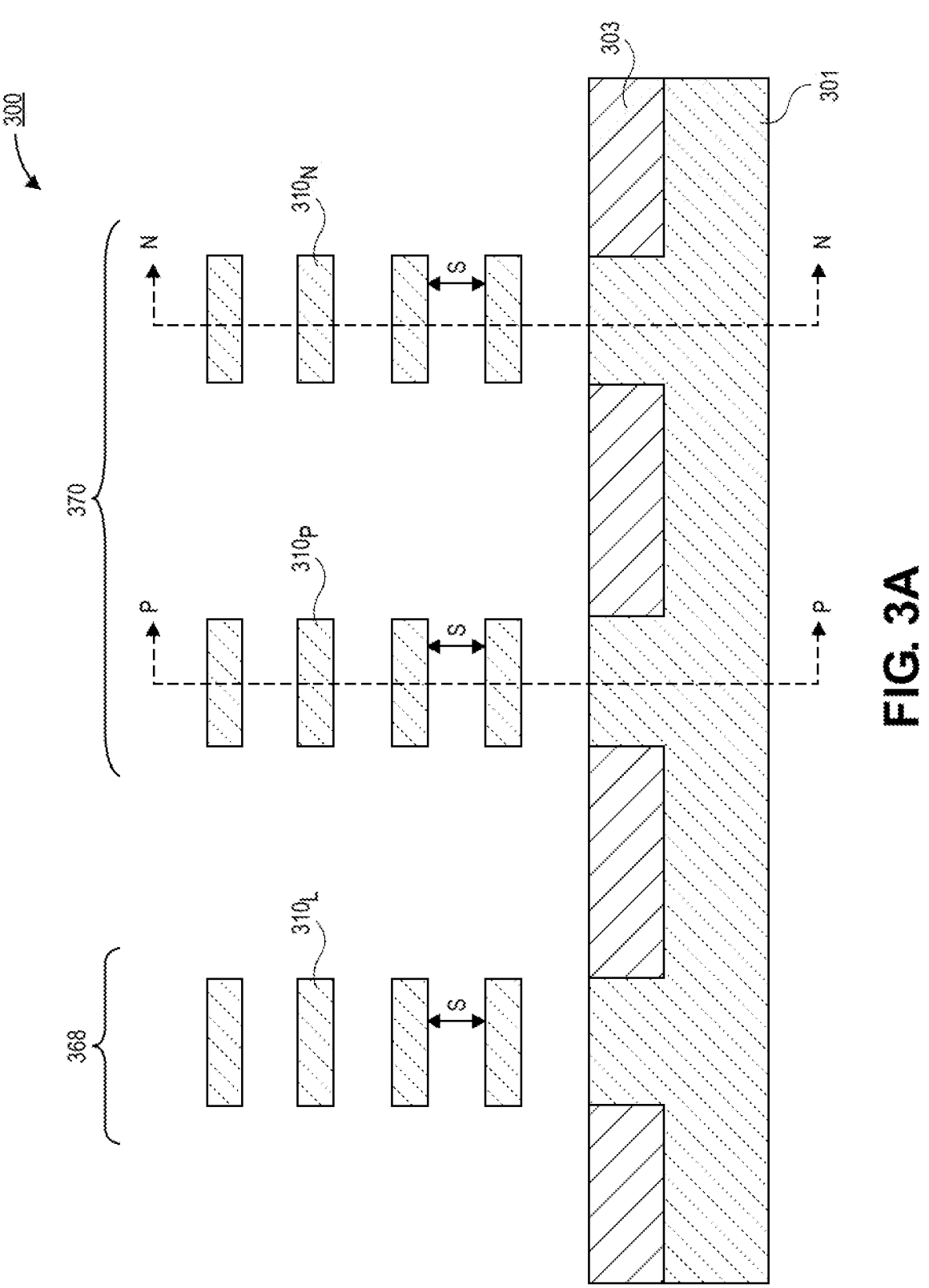
FIG. 3A is a cross-sectional illustration of a semiconductor device with a first stack of nanoribbons for a logic transistor, a second stack of nanoribbons for a P-type high-voltage transistor, and a third stack of nanoribbons for an N-type high voltage transistor, in accordance with an embodiment.

Referring now to FIG. 3A, a cross-sectional illustration of an electronic device 300 is shown, in accordance with an embodiment. In an embodiment, the electronic device 300 comprises a substrate 301. Isolation material 303 may also be included on the substrate 301. A logic region 368 and a high-voltage region 370 may be included in the electronic device 300. In an embodiment, vertically stacked nanoribbons 310 may be disposed in each region. A stack of nanoribbons $310_L$ for use in a logic transistor is in the logic region 368, a stack of nanoribbons $310_P$ for use in a P-type high-voltage transistor is in the high-voltage region 370, and a stack of nanoribbons $310_N$ for use in an N-type high voltage transistor is in the high-voltage region 370.

As shown, each of the three stacks of nanoribbons $310_L$, $310_P$, and $310_N$ are substantially uniform. For example, the nanoribbons $310_L$, $310_P$, and $310_N$ all have a uniform spacing S. The spacing S may be chosen to optimize the switching performance of the logic transistors in the logic region 368. That is, the spacing S may be too small to accommodate a substantially thick gate dielectric in the high-voltage region 370. In an embodiment, the spacing S may be approximately 10 nm or less.

Figure 3B:
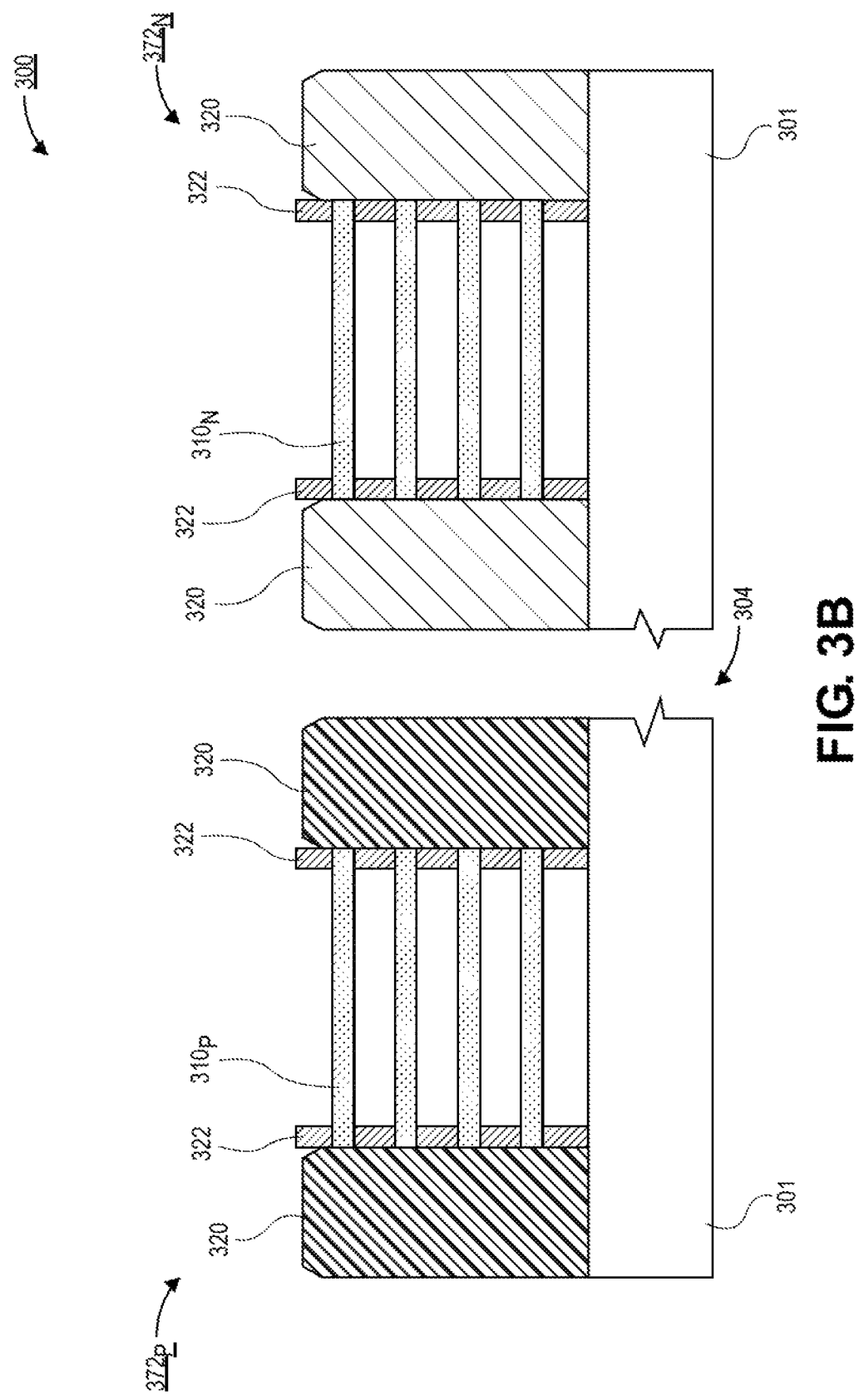
FIGS. 3B-3F are cross-sectional illustrations depicting a process for forming a P-type transistor and an N-type transistor from the second stack of nanoribbons and the third stack of nanoribbons in FIG. 3A, in accordance with an embodiment.

Referring now to FIG. 3B, a cross-sectional illustration of the device 300 along the length of nanoribbons $310_P$ and nanoribbons $310_N$ is shown, in accordance with an embodiment. In FIG. 3B, the substrate 301 includes a break 304. The break 304 may indicate that the P-type transistor $372_P$ and the N-type transistor $372_N$ are on different fins. In other embodiments, the P-type transistor $372_P$ and the N-type transistor $372_N$ may be formed on a single fin. FIG. 3B omits the transistor in the logic region 368. The logic transistor may be formed using standard nanoribbon processing operations, and will not be described in greater detail for simplicity.

In an embodiment, the P-type transistor $372_P$ comprises a stack of nanoribbons $310_P$. Source/drain regions 320 are disposed on opposite ends of the nanoribbons $310_P$. The nanoribbons $310_P$ may pass through spacers 322. Similarly, the N-type transistor $372_N$ comprises a stack of nanoribbons $310_N$. Source/drain regions 320 are disposed on opposite ends of the nanoribbons $310_N$. The nanoribbons $310_N$ may pass through spacers 322. The source/drain regions 320 in the P-type transistor $372_P$ may be a different material (or include different doping) than the source/drain regions 320 in the N-type region 372$_N$, as indicated by the different shadings.

In an embodiment, the structure illustrated in FIG. 3B may be fabricated using techniques common to the formation of nanoribbons devices. For example, the nanoribbons 310 may be released from a stack comprising sacrificial layers (not shown) between each of the nanoribbons 310. The sacrificial layers may be removed after a sacrificial gate (not shown) that is formed over the channel region of the nanoribbons 310 is removed. The spacers 322 may be formed along sidewalls of the sacrificial gate prior to the formation of the source/drain regions 320. The source/drain regions 320 may be formed with an epitaxial growth process, or the like.

Figure 3C:
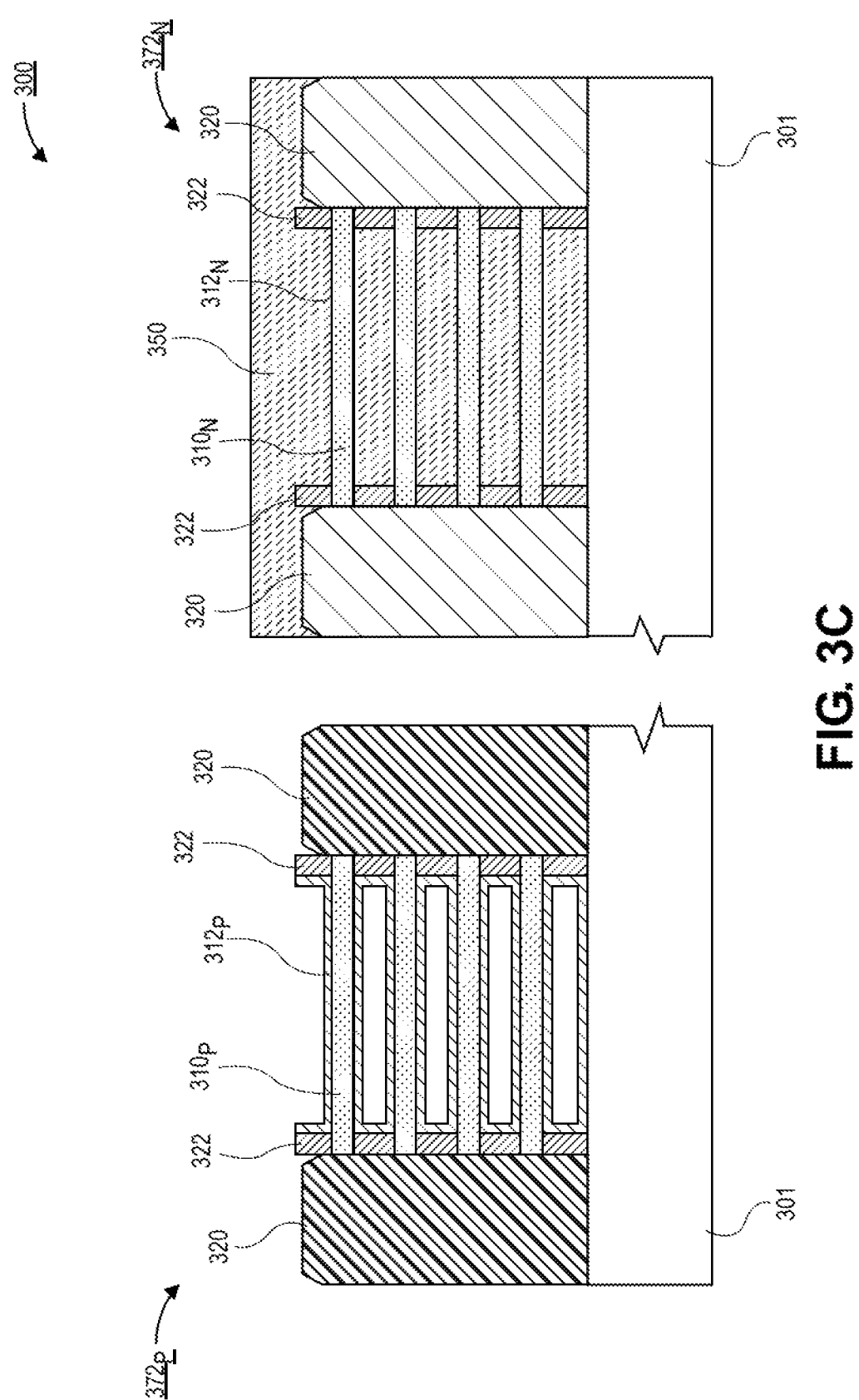

Referring now to FIG. 3C, a cross-sectional illustration after a gate dielectric 312$_P$ is disposed in the channel region of the P-type transistor 372$_P$ is shown, in accordance with an embodiment. The gate dielectric 312$_P$ may be formed with a deposition process (e.g., ALD) or an oxidation process. During the formation of the gate dielectric 312$_P$, the N-type transistor 372$_N$ may be covered. For example, a mask layer 350 is disposed over the N-type transistor 372$_N$.

In an embodiment, the gate dielectric 312$_P$ may be any gate dielectric such as those described in greater detail above. For example, the gate dielectric 312$_P$ may comprise an oxide (e.g., $SiO_2$ or $HfO_2$) with or without an annealing treatment. In other embodiments, the gate dielectric 312$_P$ may be a hybrid gate dielectric that comprises a first layer (e.g., an oxide) and a second layer (e.g., a dipole material). In an embodiment, the one or both of the layers in a hybrid gate dielectric may be annealed.

Figure 3D:
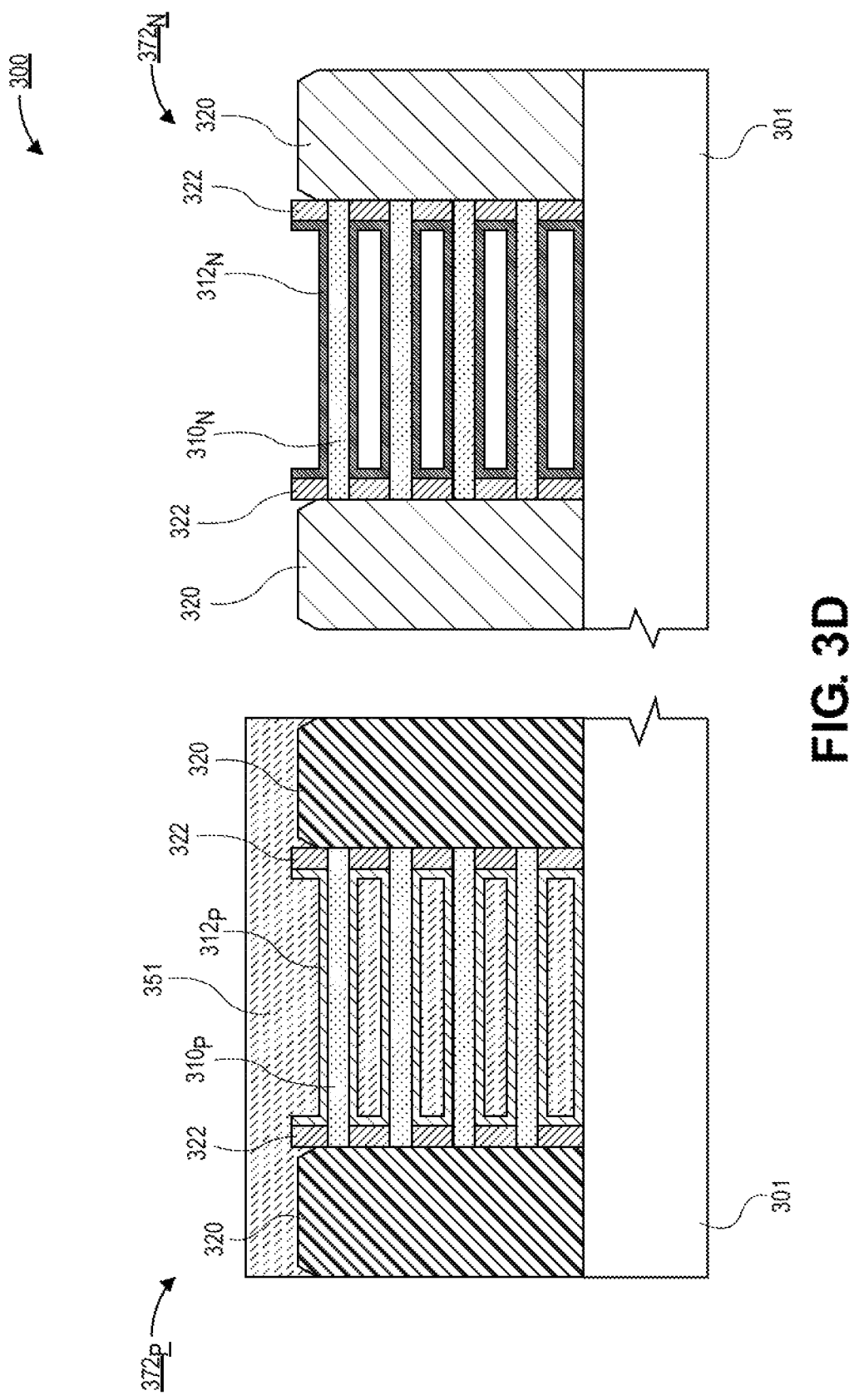

Referring now to FIG. 3D, a cross-sectional illustration after a gate dielectric 312$_N$ is disposed in the channel region of the N-type transistor 372$_N$ is shown, in accordance with an embodiment. In an embodiment, the mask layer 350 is removed from the N-type transistor 372$_N$, and the P-type transistor 372$_P$ is covered by a mask layer 351. Thereafter, the gate dielectric 312$_N$ may be formed with a deposition process (e.g., ALD) or an oxidation process. In an embodiment, the gate dielectric 312$_P$ may be any gate dielectric such as those described in greater detail above. For example, the gate dielectric 312$_N$ may comprise an oxide (e.g., $SiO_2$ or $HfO_2$) with or without an annealing treatment. In other embodiments, the gate dielectric 312$_N$ may be a hybrid gate dielectric that comprises a first layer (e.g., an oxide) and a second layer (e.g., a dipole material). In an embodiment, the one or both of the layers in a hybrid gate dielectric may be annealed.

In an embodiment, the gate dielectric 312$_P$ in the P-type transistor 372$_P$ is different than the gate dielectric 312$_N$ in the N-type transistor 372$_N$. For example, the gate dielectric 312$_P$ and 312$_N$ may be subject to different annealing treatments and/or comprise different materials. The differences between the gate dielectric 312$_P$ and the gate dielectric 312$_N$ allows for VT tuning. For example, a VT of the P-type transistor 372$_P$ may be increased whereas the VT of the N-type transistor 372$_N$ may be decreased.

Figure 3E:
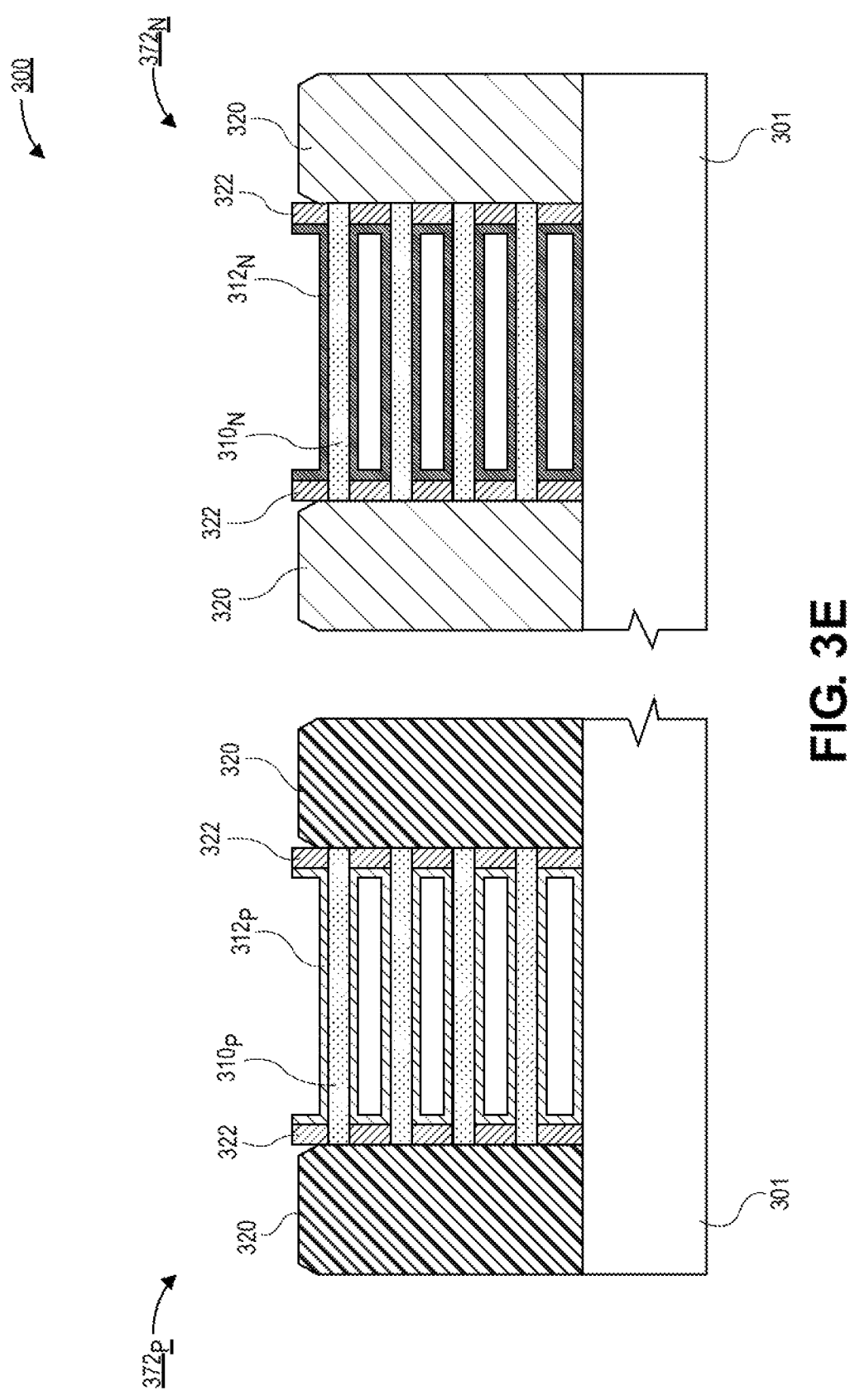

Referring now to FIG. 3E, a cross-sectional illustration of the electronic device 300 after the mask layer 351 is removed is shown, in accordance with an embodiment. Removal of the mask layer 351 exposes the channel regions of both the P-type transistor 372$_P$ and the N-type transistor 372$_N$. In an embodiment, the mask layer 351 may be removed with an ashing process, or any other suitable etching process.

Figure 3F:
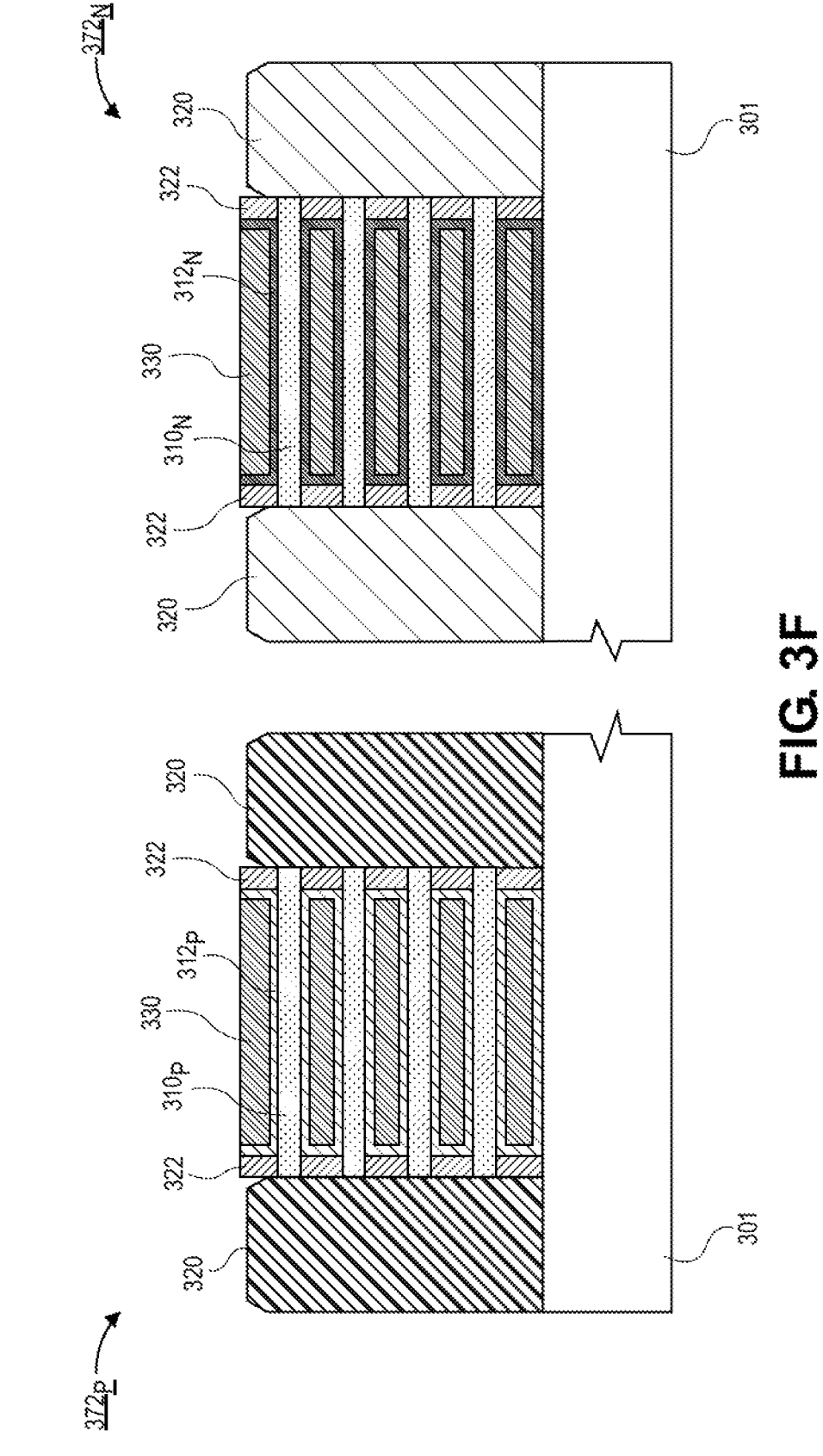

Referring now to FIG. 3F, a cross-sectional illustration of the electronic device 300 after gate electrodes 330 are disposed in the channel regions of the P-type transistor 372$_P$ and the N-type transistor 372$_N$ is shown, in accordance with an embodiment. In an embodiment, the gate electrodes 330 comprise the same material for both transistors 372$_P$ and 372$_N$. That is, instead of relying on different work function metals to provide VT modulation, embodiments disclosed herein provide the VT modulation as a result of different gate dielectrics 312$_P$ and 312$_N$. Accordingly, the reliability concerns arising from the deposition of two different work function metals (e.g., residual portions of a first work function metal remaining in a transistor that requires a second work function metal) are eliminated. Accordingly, high reliability and high V MAX are provided in embodiments disclosed herein.

Figure 3G:
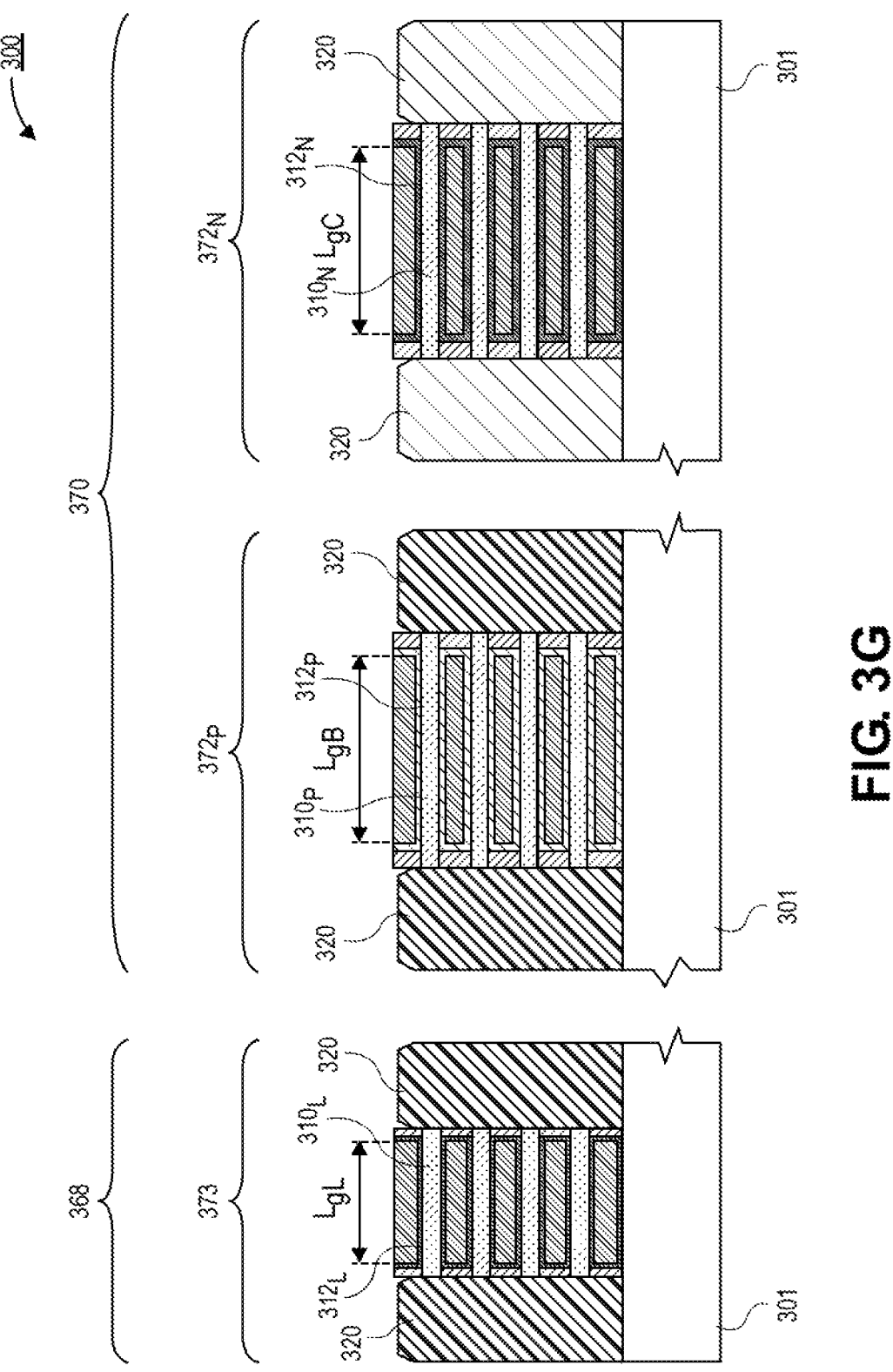
FIG. 3G is a cross-sectional illustration of a logic transistor, a P-type high-voltage transistor, and an N-type high-voltage transistor, in accordance with an embodiment.

Referring now to FIG. 3G, a cross-sectional illustration of an electronic device 300 that illustrates a transistor 373 in the logic region 368, a P-type transistor 372$_P$ in the high-voltage region 370, and an N-type transistor 372$_N$ in the high-voltage region 370 is shown, in accordance with an embodiment. In an embodiment, the P-type transistor 372$_P$ and the N-type transistor 372$_N$ are substantially similar to the transistors described in FIG. 3F.

In an embodiment, the logic transistor 373 is formed from the nanoribbons 310$_L$ in FIG. 3A. The logic transistor 373 may comprise nanoribbons 310$_L$ and a gate dielectric 312$_L$. The gate dielectric 312$_L$ may have a thickness that is less than the thickness of the P-type gate dielectric 312$_P$ and/or the N-type dielectric 312$_N$. In an embodiment, the logic transistor 373 may have a first channel length $L_{gL}$. The first channel length $L_{gL}$ may be smaller than the second channel length $L_{gB}$ and the third channel length $L_{gC}$ of the transistors 372 in the high-voltage region 370. In an embodiment, the second channel length $L_{gB}$ and the third channel length $L_{gC}$ may be substantially similar to each other. In an embodiment, the second channel length $L_{gB}$ and the third channel length $L_{gC}$ may be approximately 50 nm or greater, 100 nm or greater, or 150 nm or greater. The longer channel lengths $L_{gB}$ and $L_{gC}$ (in addition to the thicker gate dielectrics 312$_P$ and 312$_N$) allow for higher voltage to be supported by transistors 372 in the high-voltage region 370.

Referring now to FIGS. 4A-4D, a series of cross-sectional illustrations depicting a process for forming a P-type transistor 472$_P$ and an N-type transistor 472$_N$ using gate dielectric variations for modulating the VT is shown, in accordance with an additional embodiment. Particularly, the embodiment shown in FIGS. 4A-4D depicts a process for depositing a single gate dielectric material over both transistors, followed by separate annealing processes to provide the desired VT modulation.

Figure 4A:
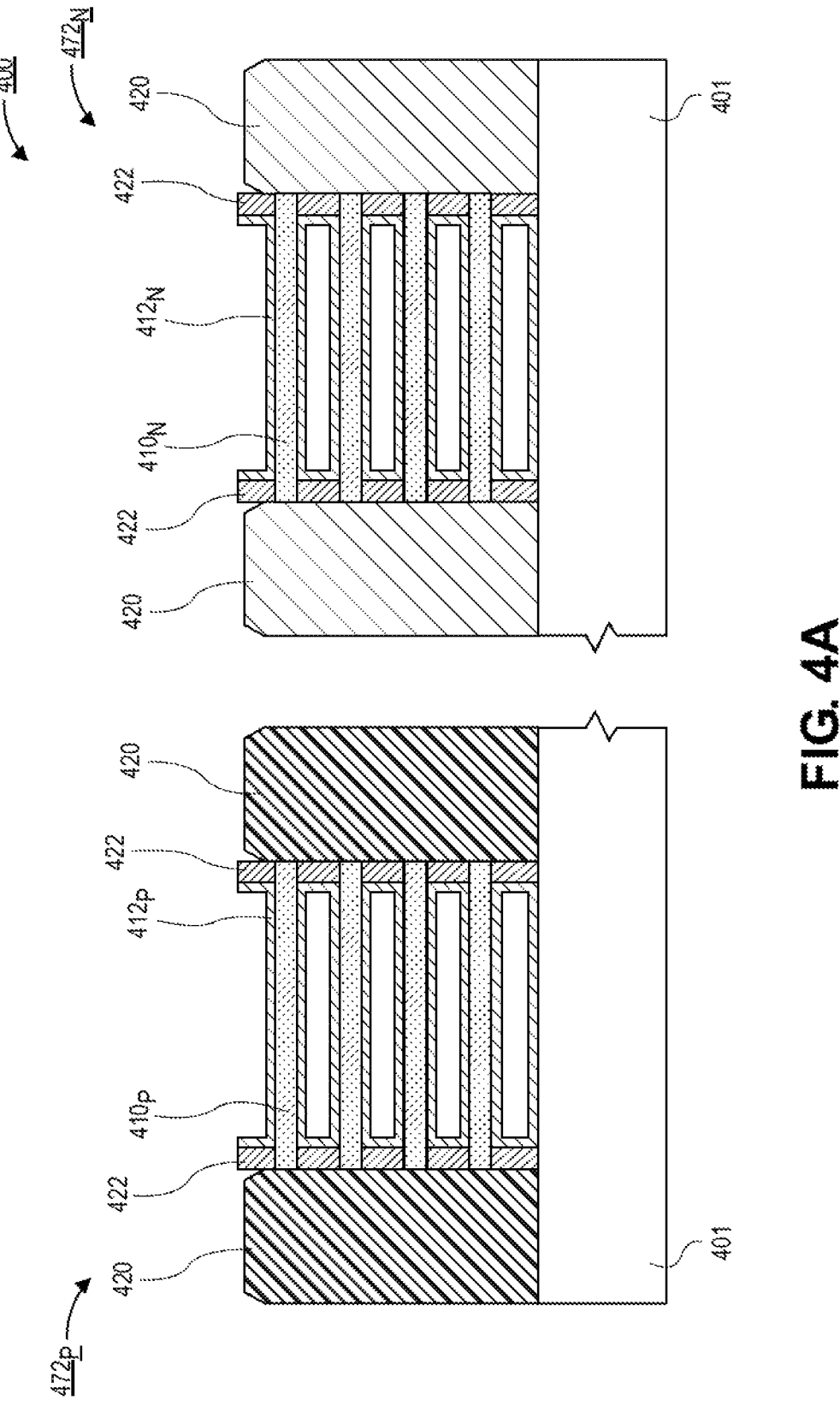
FIGS. 4A-4D are cross-sectional illustrations depicting a process for forming a P-type transistor and an N-type transistor, in accordance with an embodiment.

Referring now to FIG. 4A, a cross-sectional illustration an electronic device 400 is shown, in accordance with an embodiment. The electronic device 400 comprises a P-type transistor 472$_P$ and an N-type transistor 472$_N$ disposed over a substrate 401. The P-type transistor 472$_P$ and the N-type transistor 472$_N$ are illustrated after a sacrificial gate electrode is removed and gate dielectrics 412$_P$ and 412$_N$ are disposed over channel regions of nanoribbons 410$_P$ and 410$_N$, respectively. In an embodiment, the gate dielectrics 412$_P$ and 412$_N$ comprise the same material. A blanket ALD deposition process may be used to deposit both dielectrics 412$_P$ and 412$_N$ simultaneously. Alternatively, an oxidation process may be used to form both dielectrics 412$_P$ and 412$_N$ simultaneously. Accordingly, the material composition and the dimensions (e.g., thickness) of the dielectrics 412$_P$ and 412$_N$ are the same in some embodiments. Both transistors 472$_P$ and $472_N$ may also comprise source/drain regions 420 and spacers 422. The source/drain regions 420 and spacers 422 may be similar to those described above and formed with similar processes.

Figure 4B:
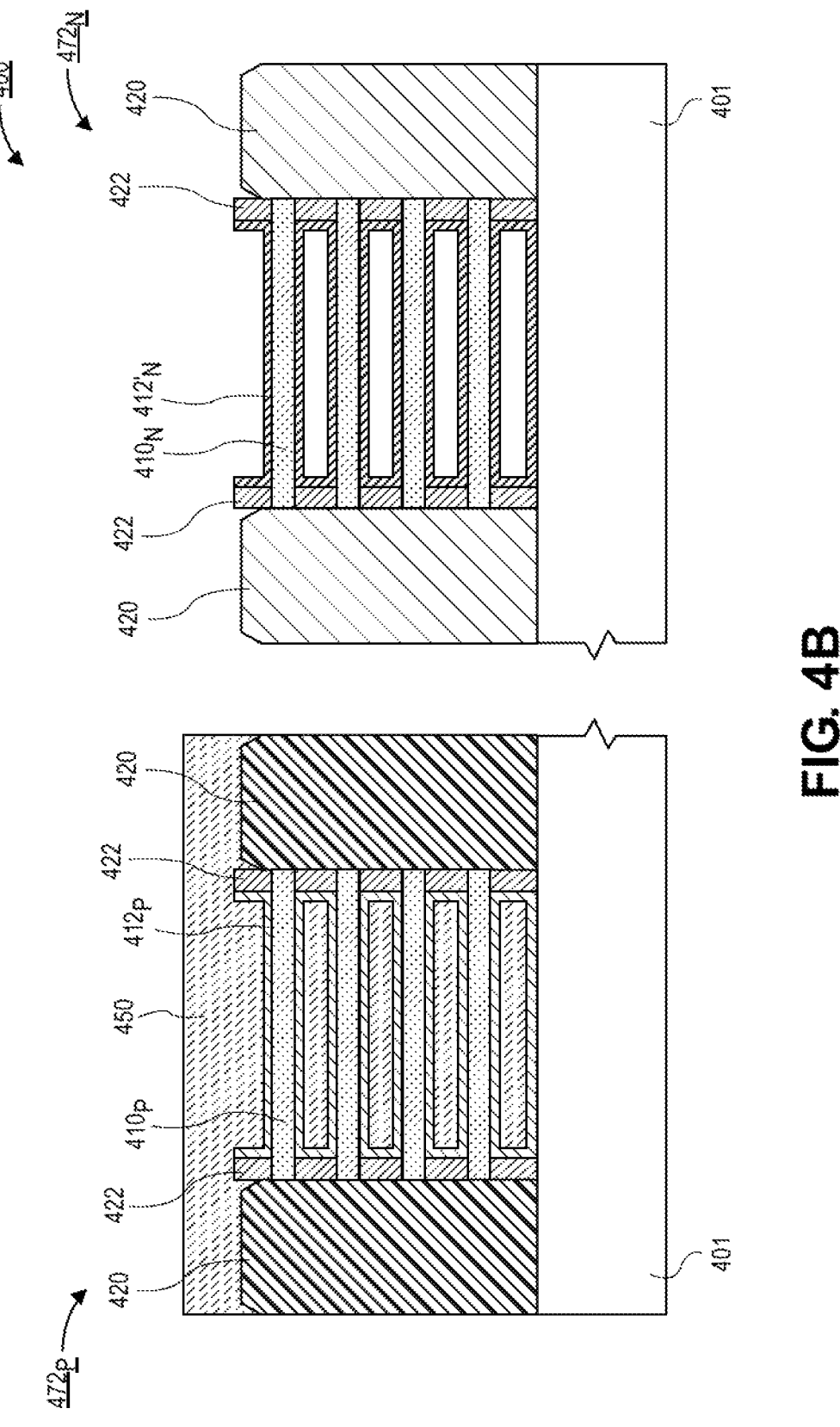

Referring now to FIG. 4B, a cross-sectional illustration after a first mask layer 450 is disposed over the P-type transistor $472_P$ and the gate dielectric $412_N$ is treated with a first annealing process is shown, in accordance with an embodiment. In an embodiment, the first annealing process converts the gate dielectric $412_N$ into an annealed gate dielectric $412'_N$. In an embodiment the first annealing process may be substantially similar to one of the annealing processes described above in order to provide a modulated VT. For example, the annealing process may result in an N-type transistor $472_N$ with a decreased VT. In an embodiment, the first annealing process may comprise an anneal in an $NH_3$ ambient. As such, a surface of the gate dielectric $412'_N$ may have a first concentration of nitrogen.

Figure 4C:
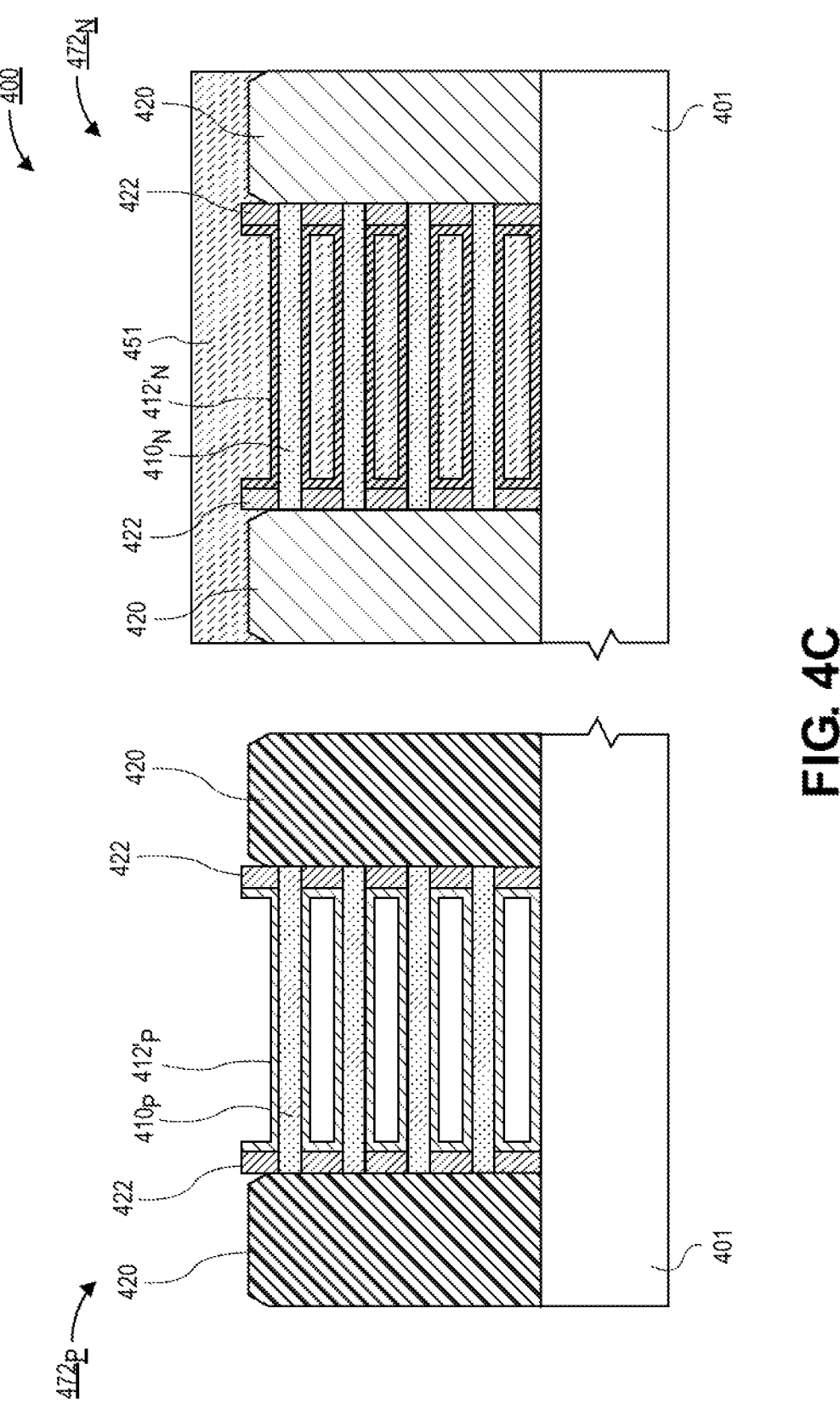

Referring now to FIG. 4C, a cross-sectional illustration of the electronic device 400 after the first mask 450 is removed and a second mask 451 is disposed over the N-type transistor $472_N$ is shown, in accordance with an embodiment. The second mask 451 protects the gate dielectric $412'_N$ from subsequent treatments. For example, the gate dielectric $412_P$ may be treated with a second annealing process to provide annealed gate dielectric $412'_P$. In an embodiment, the second annealing process is different than the first annealing process. In an embodiment the second annealing process may be substantially similar to one of the annealing processes described above in order to provide a modulated VT. For example, the annealing process may result in a P-type transistor $472_P$ with an increased VT. In an embodiment, the second annealing process may comprise an anneal in an $NH_3$ ambient. As such, a surface of the gate dielectric $412'_P$ may have a second concentration of nitrogen. The second concentration of nitrogen may be different than the first concentration of nitrogen.

In other embodiments, the operations in FIG. 4C may be omitted. That is, only the gate dielectric $412'_N$ of the N-type transistor $472_N$ may be modulated with an annealing process. Alternatively, in some embodiments, only the gate dielectric $412'_P$ of the P-type transistor $472_P$ may be modulated with an annealing process.

Figure 4D:
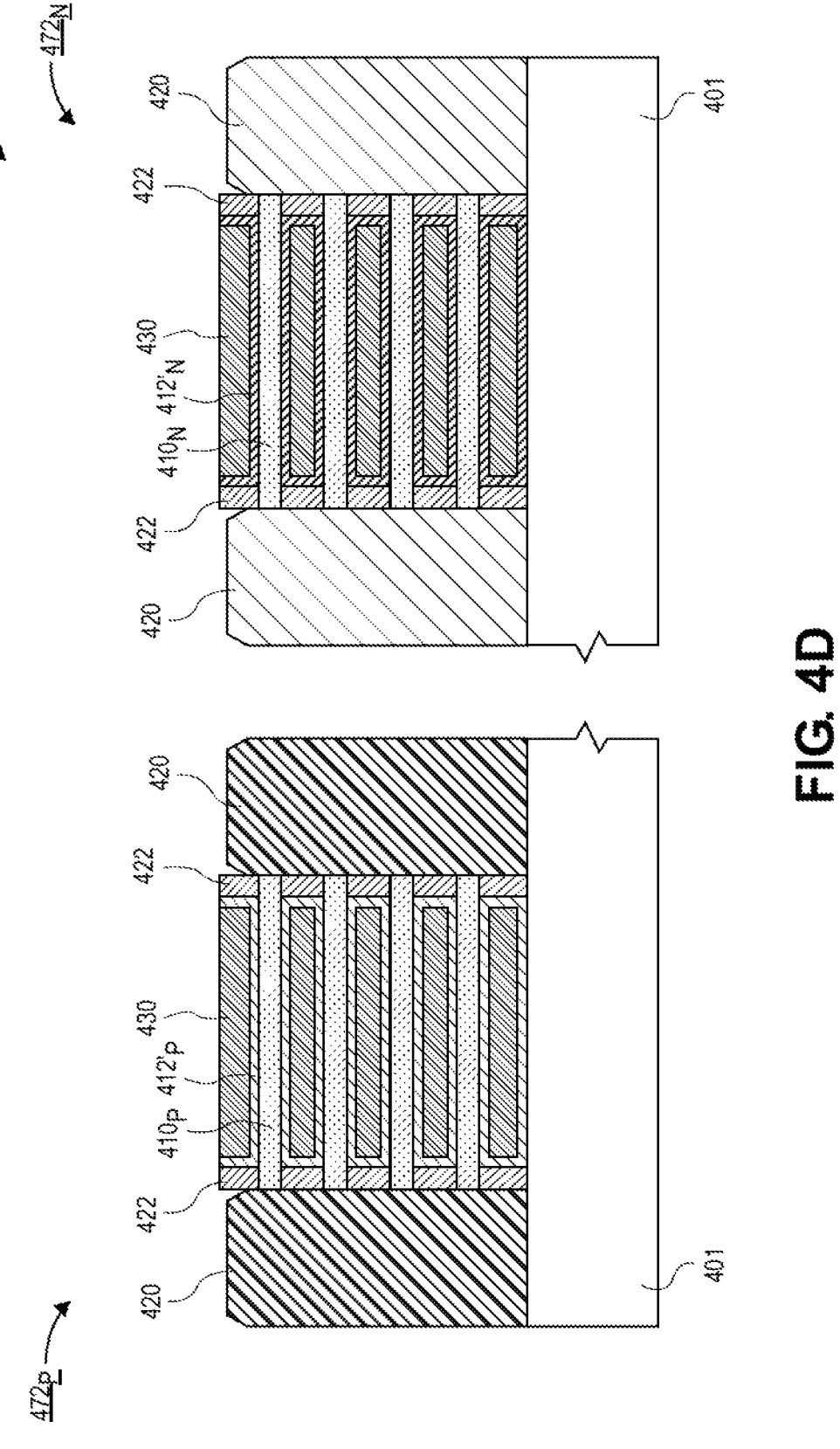

Referring now to FIG. 4D, a cross-sectional illustration of the electronic device 400 after gate electrodes 430 are disposed in the channel regions of the P-type transistor $472_P$ and the N-type transistor $472_N$ is shown, in accordance with an embodiment. In an embodiment, the gate electrodes 430 comprise the same material for both transistors $472_P$ and $472_N$. That is, instead of relying on different work function metals to provide VT modulation, embodiments disclosed herein provide the VT modulation as a result of different gate dielectrics $412'_P$ and $412'_N$ (or $412_P$ and $412'_N$, or $412'_P$ and $412_N$). Accordingly, the reliability concerns arising from the deposition of two different work function metals (e.g., residual portions of a first work function metal remaining in a transistor that requires a second work function metal) are eliminated. Accordingly, high reliability and high V MAX are provided in embodiments disclosed herein.

Figure 5A:
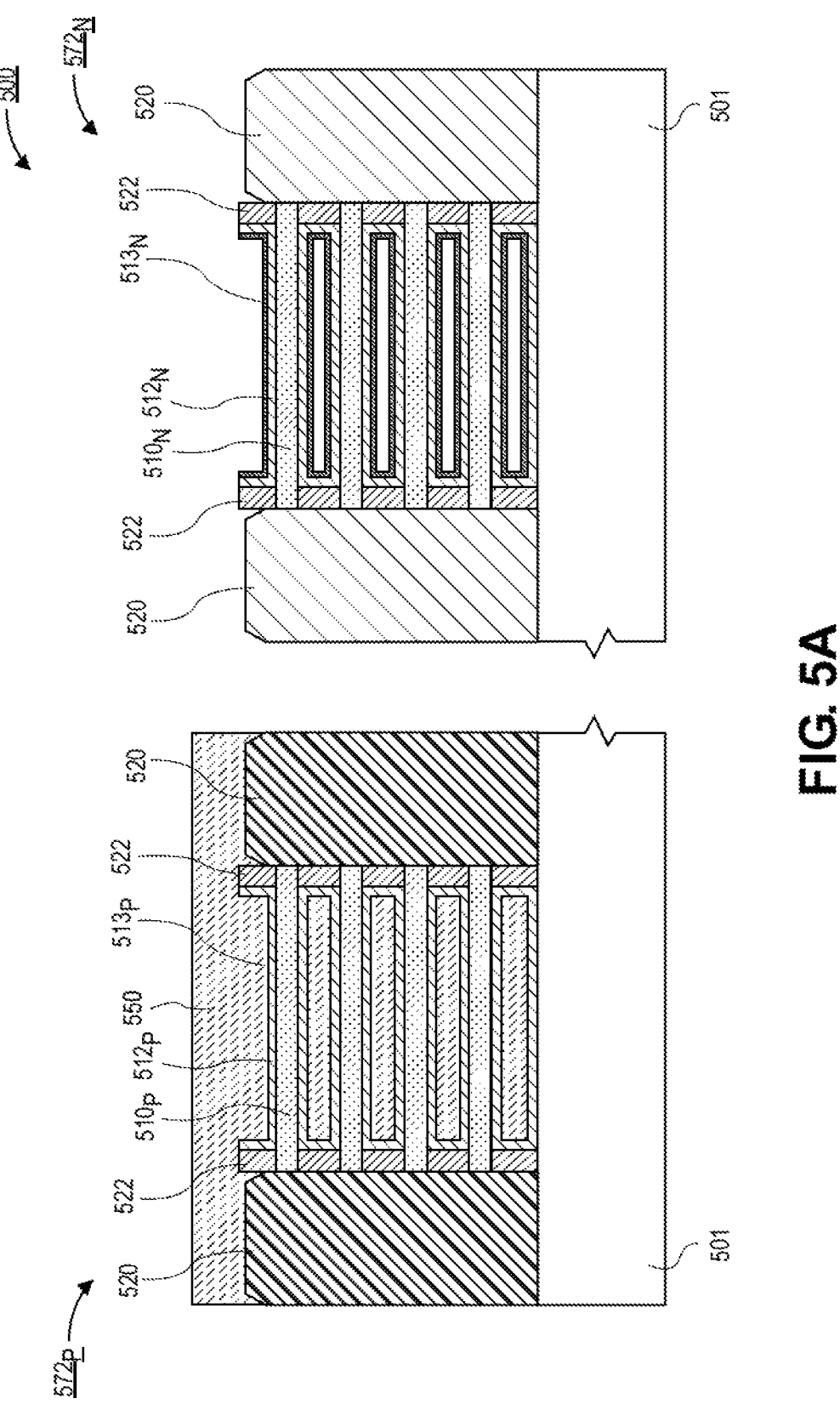
FIGS. 5A-5C are cross-sectional illustrations depicting a process for forming a P-type transistor and an N-type transistor, in accordance with an additional embodiment.
Figure 5B:
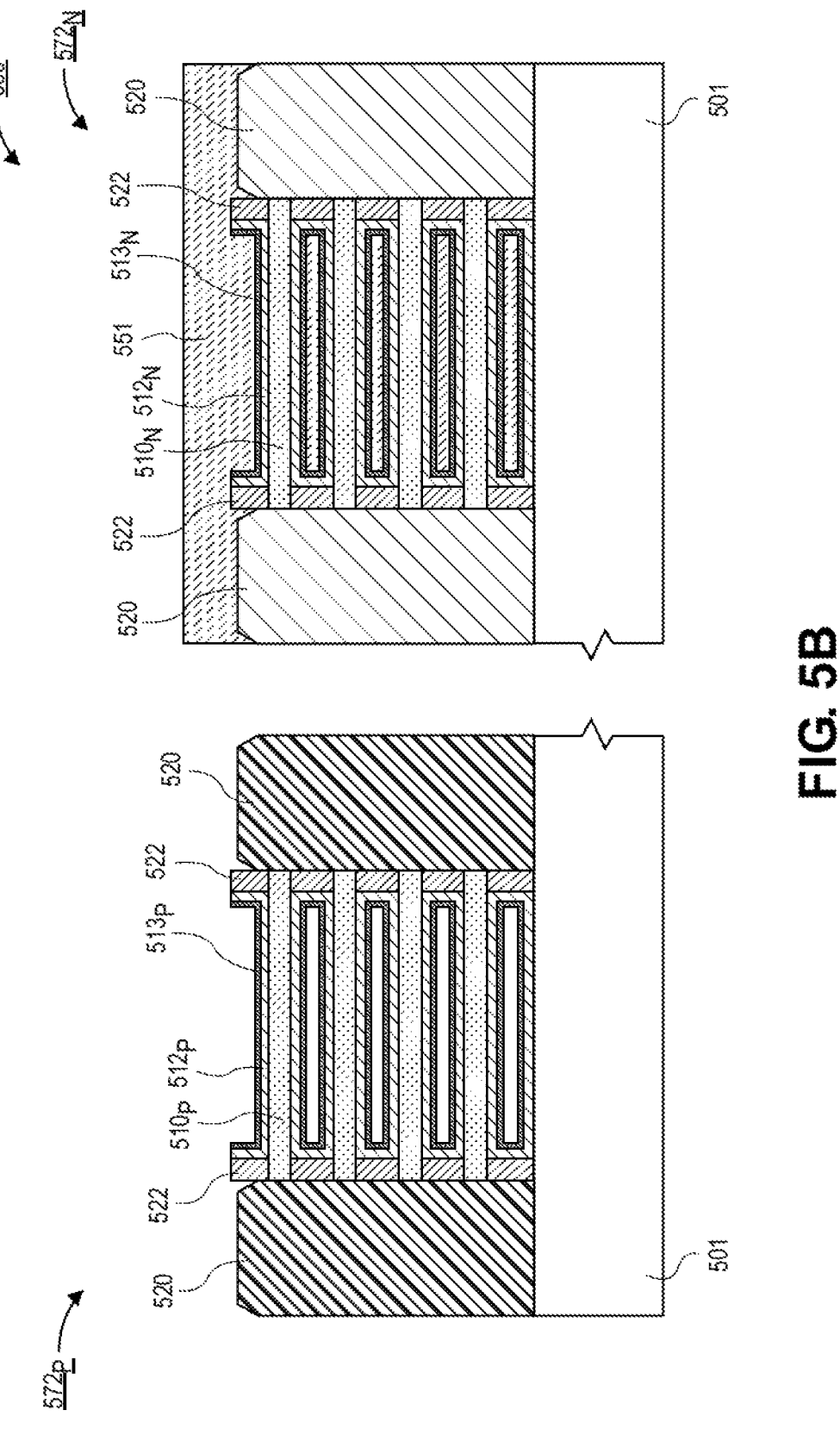
Figure 5C:
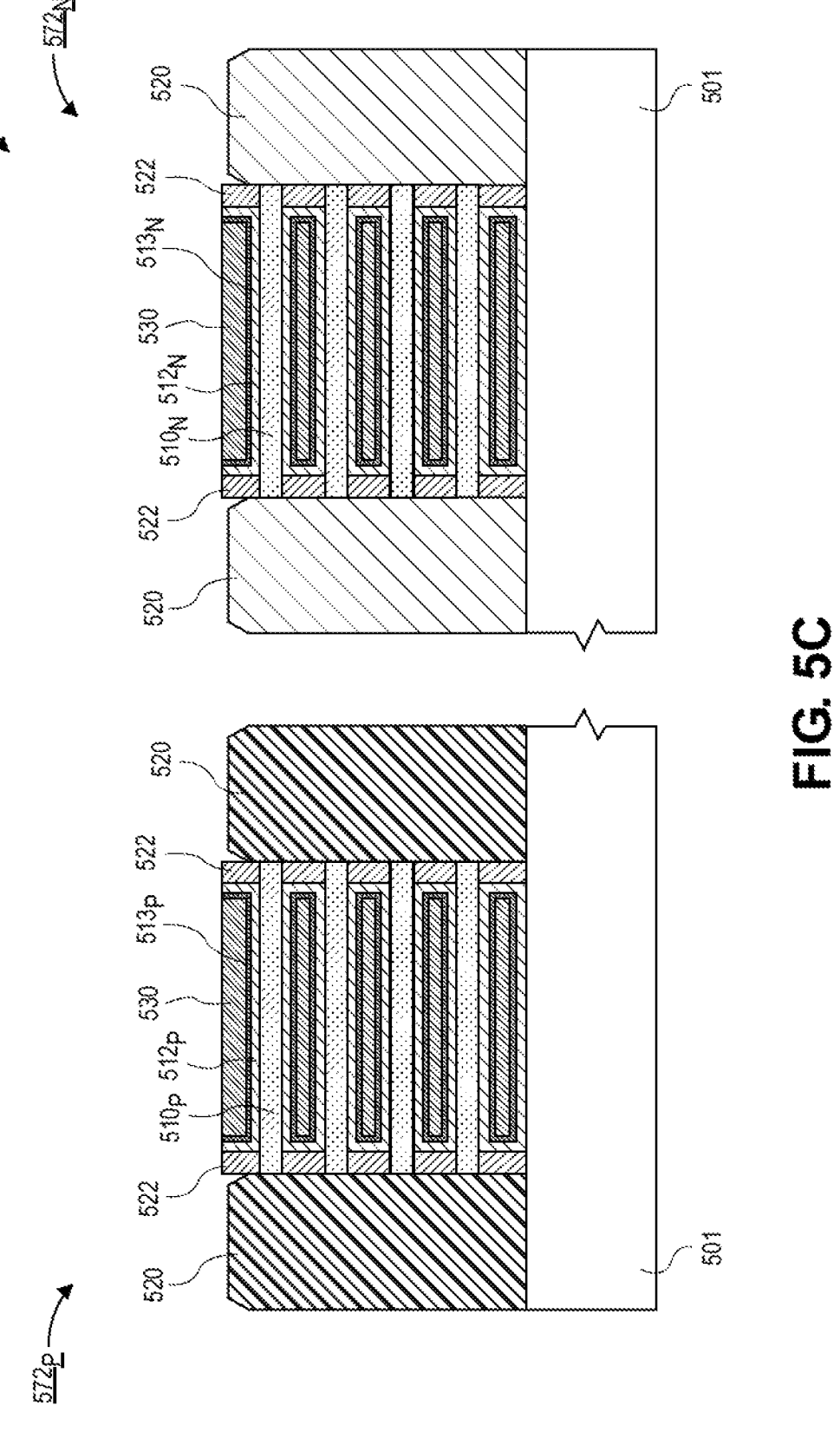

Referring now to FIGS. 5A-5C, a series of cross-sectional illustrations depicting a process for forming a P-type transistor $572_P$ and an N-type transistor $572_N$ using gate dielectric variations for modulating the VT is shown, in accordance with an additional embodiment. Particularly, the embodiment shown in FIGS. 5A-5C depicts a process for depositing a single gate dielectric material over both transistors, followed by the deposition of different second dielectric layers in order to modulate the VT.

Referring now to FIG. 5A, a cross-sectional illustration of an electronic device 500 with a P-type transistor $572_P$ and an N-type transistor $572_N$ over a substrate 501 is shown, in accordance with an embodiment. The P-type transistor $572_P$ and the N-type transistor $572_N$ are illustrated after a sacrificial gate electrode is removed and gate dielectrics $512_P$ and $512_N$ are disposed over channel regions of nanoribbons $510_P$ and $510_N$, respectively. In an embodiment, the gate dielectrics $512_P$ and $512_N$ comprise the same material. A blanket ALD deposition process may be used to deposit both dielectrics $512_P$ and $512_N$ simultaneously. Alternatively, an oxidation process may be used to form both dielectrics $512_P$ and $512_N$ simultaneously. Accordingly, the material composition and the dimensions (e.g., thickness) of the dielectrics $512_P$ and $512_N$ are the same in some embodiments. Both transistors $572_P$ and $572_N$ may also comprise source/drain regions 520 and spacers 522. The source/drain regions 520 and spacers 522 may be similar to those described above and formed with similar processes.

As shown in FIG. 5A, the P-type transistor $572_P$ is covered with a mask layer 550, and a second dielectric layer $513_N$ is disposed over the gate dielectric $512_N$. In an embodiment, the second dielectric layer $513_N$ comprises a dipole material. For example, the second dielectric layer $513_N$ may comprise one or more of $La_2O_3$, $ZrO_2$, $Y_2O_3$, and $TiO_2$. In an embodiment, one or both of the gate dielectric $512_N$ and the second dielectric layer $513_N$ may be annealed.

Referring now to FIG. 5B, a cross-sectional illustration after the first mask 550 is removed and a second mask 551 is disposed over the N-type transistor $572_N$, and a second dielectric layer $513_P$ is disposed over the gate dielectric $512_P$ is shown, in accordance with an embodiment. In an embodiment, the second dielectric layer $513_P$ is a different material than the second dielectric layer $513_N$. In an embodiment, the second dielectric layer $513_P$ is a dipole material. For example, the second dielectric layer $513_P$ may comprise one or more of $La_2O_3$, $ZrO_2$, $Y_2O_3$, and $TiO_2$. In an embodiment, one or both of the gate dielectric $512_P$ and the second dielectric layer $513_P$ may be annealed.

In other embodiments, the operations in FIG. 5B may be omitted. That is, in some embodiments, only the N-type transistor $572_N$ comprises a hybrid gate dielectric comprising a second dielectric layer $513_N$ over the gate dielectric $512_N$, and the P-type transistor $572_P$ comprises a gate dielectric $512_P$ without any overlying dielectric layer. Alternatively, in some embodiments, only the P-type transistor $572_P$ comprises a hybrid gate dielectric comprising a second dielectric layer $513_P$ over the gate dielectric $512_P$, and the N-type transistor $572_N$ comprises a gate dielectric $512_N$ without any overlying dielectric layer.

Referring now to FIG. 5C, a cross-sectional illustration of the electronic device 500 after the second mask 551 is removed, and after gate electrodes 530 are disposed in the channel regions of the P-type transistor $572_P$ and the N-type transistor $572_N$ is shown, in accordance with an embodiment. In an embodiment, the gate electrodes 530 comprise the same material for both transistors $572_P$ and $572_N$. That is, instead of relying on different work function metals to provide VT modulation, embodiments disclosed herein provide the VT modulation as a result of different gate dielectrics $513_P$ and $513_N$ (or $512_P$ and $513_N$, or $513_P$ and $512_N$). Accordingly, the reliability concerns arising from the deposition of two different work function metals (e.g., residual portions of a first work function metal remaining in a transistor that requires a second work function metal) are eliminated. Accordingly, high reliability and high V MAX are provided in embodiments disclosed herein.

Figure 6:
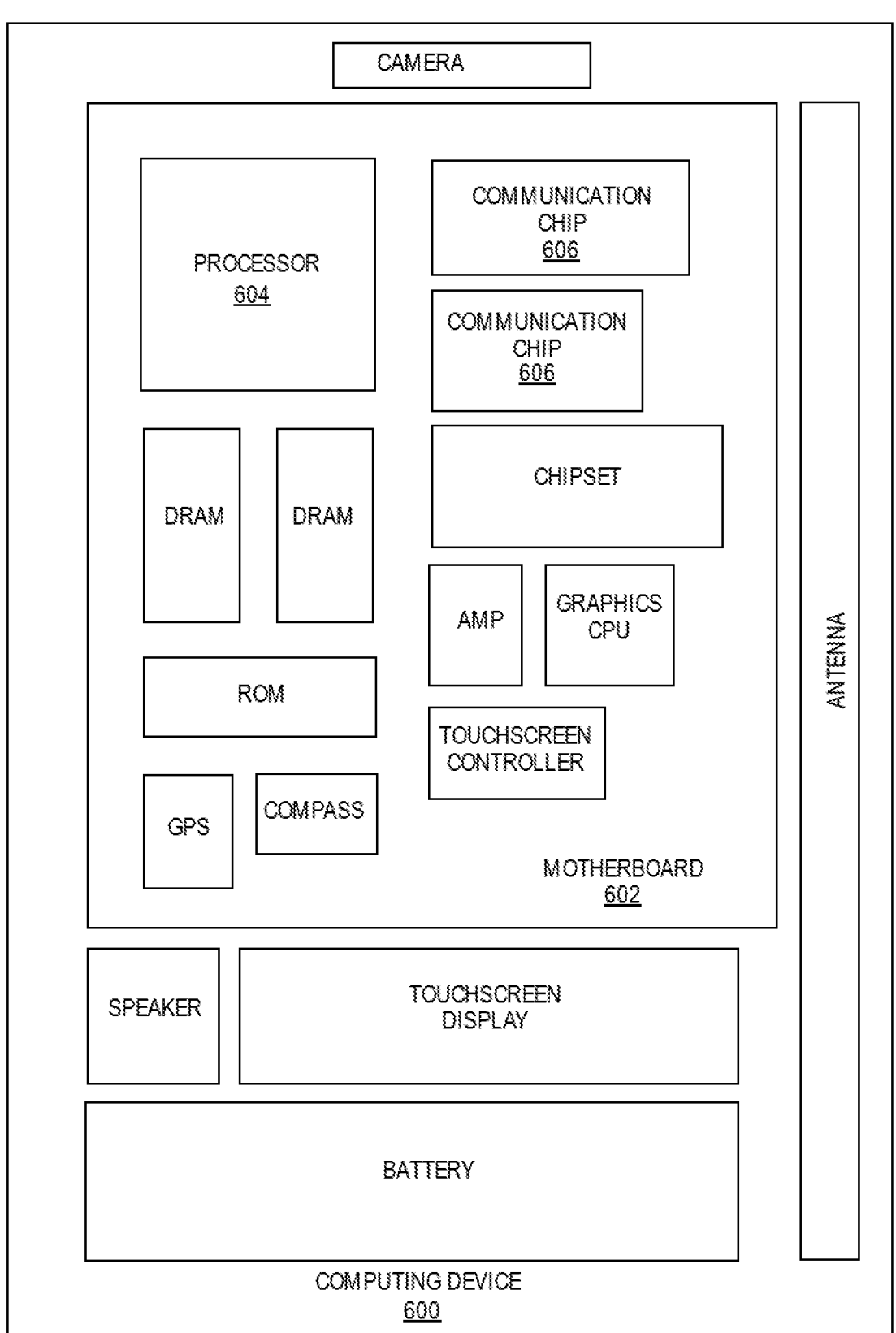
FIG. 6 illustrates a computing device in accordance with one implementation of an embodiment of the disclosure.

FIG. 6 illustrates a computing device 600 in accordance with one implementation of an embodiment of the disclosure. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In an embodiment, the integrated circuit die of the processor 604 may comprise nanoribbon devices with modulated VT using various gate dielectrics, as described herein. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In an embodiment, the integrated circuit die of the communication chip 606 may comprise nanoribbon devices with modulated VT using various gate dielectrics, as described herein.

In further implementations, another component housed within the computing device 600 may comprise nanoribbon devices with modulated VT using various gate dielectrics, as described herein.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
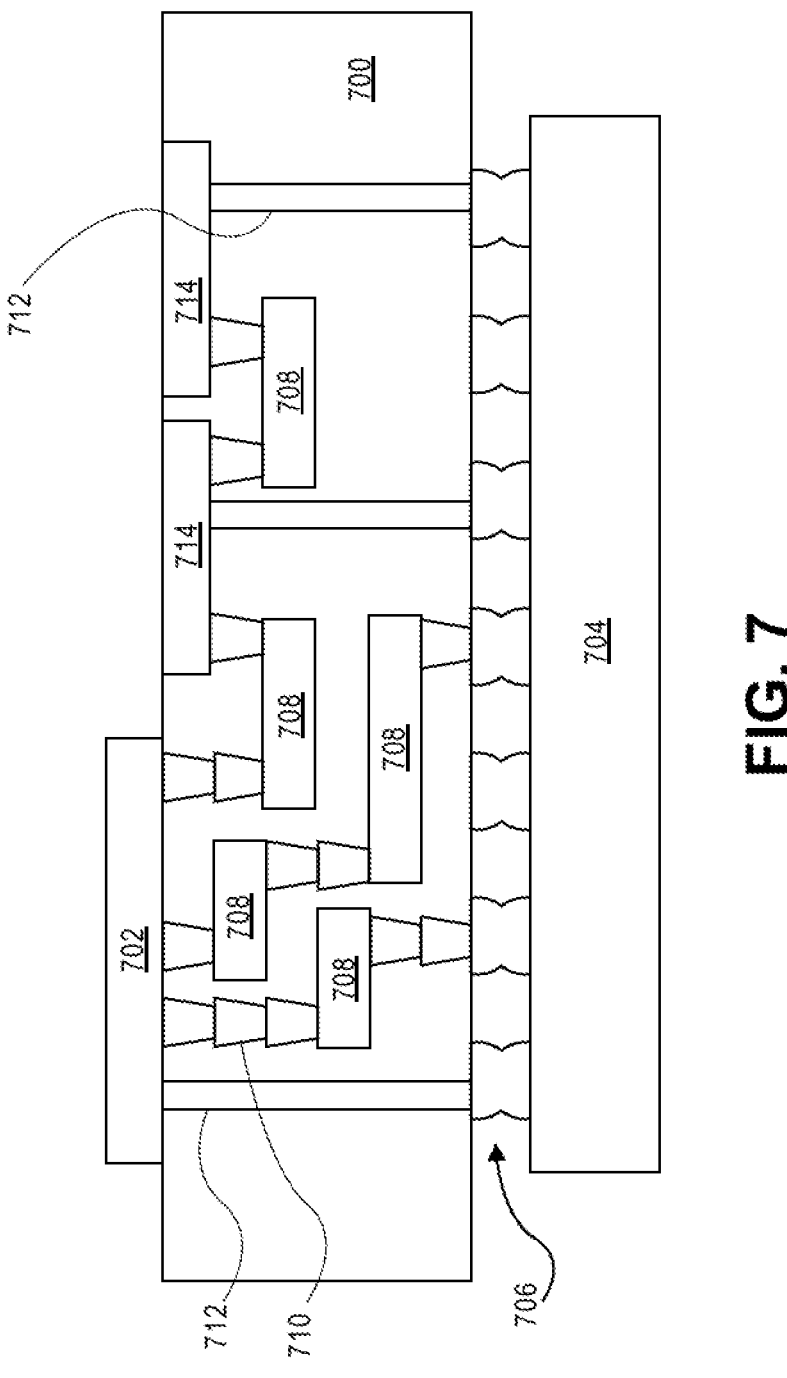
FIG. 7 is an interposer implementing one or more embodiments of the disclosure.

FIG. 7 illustrates an interposer 700 that includes one or more embodiments of the disclosure. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. In an embodiment, one of both of the first substrate 702 and the second substrate 704 may comprise nanoribbon devices with modulated VT using various gate dielectrics, a second interference pattern, and a pattern recognition feature, or be fabricated using such an overlay target, in accordance with embodiments described herein. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer 700 may be formed of alternate rigid or flexible materials that may include the same materials described above for use in a semiconductor substrate, such as silicon, germanium, and other group III-V and group IV materials The interposer 700 may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with embodiments of the disclosure, apparatuses or processes disclosed herein may be used in the fabrication of interposer 700.

Thus, embodiments of the present disclosure may comprise semiconductor devices that comprise nanoribbon devices with modulated VT using various gate dielectrics, and the resulting structures.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a semiconductor device, comprising: a substrate; a first transistor over the substrate, the first transistor comprising: a first semiconductor channel above the substrate; a first gate dielectric surrounding the first semiconductor channel; and a first gate electrode over the first gate dielectric; and a second transistor over the substrate, the second transistor comprising: a second semiconductor channel above the substrate; a second gate dielectric surrounding the second semiconductor channel, wherein the second gate dielectric is different than the first gate dielectric; and a second gate electrode over the second gate dielectric, wherein the first gate electrode and the second gate electrode comprise the same material.

Example 2: the semiconductor device of Example 1, wherein the first transistor is a P-type transistor, and wherein the second transistor is an N-type transistor.

Example 3: the semiconductor device of Example 2, wherein a threshold voltage (VT) of the P-type transistor is higher than a VT of the N-type transistor.

Example 4: semiconductor device of Examples 1-3, wherein the first gate dielectric and the second gate dielectric comprise $SiO_2$, and wherein the first gate dielectric is annealed with a first annealing treatment, and wherein the second gate dielectric is annealed with a second annealing treatment.

Example 5: the semiconductor device of Example 4, wherein one or both of the first annealing treatment and the second annealing treatment are implemented in an $NH_3$ atmosphere, and wherein a first concentration of nitrogen at an outer surface of the first gate dielectric is different than a second concentration of nitrogen at an outer surface of the second gate dielectric.

Example 6: the semiconductor device of Examples 1-5, wherein one or both of the first gate dielectric and the second gate dielectric comprise a first layer and a second layer.

Example 7: the semiconductor device of Example 6, wherein the first layer is an oxide material, and wherein the second layer is a dipole material.

Example 8: the semiconductor device of Example 7, wherein the oxide material is $SiO_2$ or $HfO_2$, and wherein the dipole material is at least one of $La_2O_3$, $ZrO_2$, $Y_2O_3$, and $TiO_2$.

Example 9: the semiconductor device of Examples 1-8, wherein the first gate dielectric has a first thickness and the second gate dielectric has a second thickness, and wherein the first thickness and the second thickness are both greater than 3 nm.

Example 10: the semiconductor device of Example 9, wherein the first thickness is different than the second thickness.

Example 11: the semiconductor device of claim 10, wherein the first semiconductor channel and the second semiconductor channel are nanowires or nanoribbons.

Example 12: a semiconductor device comprising: a substrate; a first gate all around (GAA) transistor over the substrate, the first GAA transistor comprising a first gate dielectric, wherein the first gate dielectric has a first thickness; a second GAA transistor over the substrate, the second GAA transistor comprising a second gate dielectric and a first gate electrode that is a first metal, wherein the second gate dielectric has a second thickness that is greater than the first thickness, and wherein the second GAA transistor is an N-type transistor; and a third GAA transistor over the substrate, the third GAA transistor comprising a third gate dielectric that is different than the second gate dielectric and a second gate electrode that is the first metal, wherein the third gate dielectric has a third thickness that is greater than the first thickness, and wherein the third GAA transistor is a P-type transistor.

Example 13: the semiconductor device of Example 12, wherein the first GAA transistor has a first channel length, and wherein the second GAA transistor and the third GAA transistor have a second channel length that is larger than the first channel length.

Example 14: the semiconductor device of Example 12 or Example 13, wherein each of the first GAA transistor, the second GAA transistor, and the third GAA transistor comprise: a plurality of semiconductor channels, wherein the semiconductor channels are oriented in a vertical stack.

Example 15: the semiconductor device of Example 14, wherein a first spacing between semiconductor channels in the first GAA transistor is equal to a second spacing between semiconductor channels in the second GAA transistor and the third GAA transistor.

Example 16: the semiconductor device of Example 15, wherein the first spacing is approximately 10 nm or less.

Example 17: the semiconductor device of Example 16, wherein the first thickness is approximately 3 nm or less, and wherein the second thickness and the third thickness are approximately 3 nm or greater.

Example 18: the semiconductor device of Examples 12-17, wherein the second gate dielectric and the third gate dielectric comprise $SiO_2$, wherein an outer surface of the second gate dielectric has a first concentration of nitrogen, and wherein an outer surface of the third gate dielectric comprises a second concentration of nitrogen that is different than the first concentration of nitrogen.

Example 19: the semiconductor device of Examples 12-18, wherein one or both of the second gate dielectric and the third gate dielectric comprise a first layer and a second layer.

Example 20: the semiconductor device of Example 19, wherein the first layer comprises $SiO_2$ or $HfO_2$, and wherein the second layer comprises at least one of $La_2O_3$, $ZrO_2$, $Y_2O_3$, and $TiO_2$.

Example 21: a method of forming a semiconductor device, comprising: providing a first stack of first semiconductor channels and a second stack of second semiconductor channels; disposing a first dielectric completely around outer surfaces of the first semiconductor channels; disposing a second dielectric completely around outer surfaces of the second semiconductor channels, wherein the second dielectric is different than the first dielectric; and disposing a gate metal around the first dielectric and the second dielectric, wherein the first stack of first semiconductor channels are part of a P-type transistor, and wherein the second stack of second semiconductor channels are part of an N-type transistor.

Example 22: the method of Example 21, wherein the first dielectric comprises $SiO_2$ and is treated with a first annealing process in an $NH_3$ ambient, and wherein the second dielectric comprises $SiO_2$ and is treated with a second annealing process in an $NH_3$ ambient that is different than the first annealing process.

Example 23: the method of Example 21 or Example 22, wherein one or both of the first dielectric and the second dielectric comprise a first layer and a second layer, wherein the first layer comprises $SiO_2$ or $HfO_2$, and wherein the second layer comprises at least one of $La_2O_3$, $ZrO_2$, $Y_2O_3$, and $TiO_2$.

Example 24: the electronic device, comprising: a board; a package electrically coupled to the board; and a die electrically coupled to the package, wherein the die comprises: a substrate; a first gate all around (GAA) transistor over the substrate, the first GAA transistor comprising a first gate dielectric and a first channel length, wherein the first gate dielectric has a first thickness; a second GAA transistor over the substrate, the second GAA transistor comprising a second gate dielectric, a first gate electrode that is a first metal, and a second channel length that is greater than the first channel length, wherein the second gate dielectric has a second thickness that is greater than the first thickness, and wherein the second GAA transistor is an N-type transistor; and a third GAA transistor over the substrate, the third GAA transistor comprising a third gate dielectric that is different than the second gate dielectric, the second channel length, and a second gate electrode that is the first metal, wherein the third gate dielectric has a third thickness that is greater than the first thickness, and wherein the third GAA transistor is a P-type transistor.

Example 25: the electronic device of Example 24, wherein one or both of the second gate dielectric and the third gate dielectric comprise a first layer and a second layer, wherein the first layer comprises $SiO_2$ or $HfO_2$, and wherein the second layer comprises at least one of $La_2O_3$, $ZrO_2$, $Y_2O_3$, and $TiO_2$.

What is claimed is:

1. A semiconductor device, comprising:
a substrate;
a first transistor over the substrate, the first transistor comprising:
  a first semiconductor channel above the substrate, the first semiconductor channel having a first vertical thickness and a first bottommost surface;
  a first gate dielectric surrounding the first semiconductor channel; and
  a first gate electrode over and in contact with the first gate dielectric; and
a second transistor over the substrate, the second transistor comprising:
  a second semiconductor channel above the substrate, the second semiconductor channel having a second vertical thickness and a second bottommost surface, the second vertical thickness the same as the first vertical thickness, and the second bottommost surface at a same level as the first bottommost surface;
  a second gate dielectric surrounding the second semiconductor channel, wherein the second gate dielectric is different than the first gate dielectric; and a second gate electrode over and in contact with the second gate dielectric, wherein the first gate electrode and the second gate electrode comprise the same material.

2. The semiconductor device of claim 1, wherein the first transistor is a P-type transistor, and wherein the second transistor is an N-type transistor.

3. The semiconductor device of claim 2, wherein a threshold voltage (VT) of the P-type transistor is higher than a VT of the N-type transistor.

4. The semiconductor device of claim 1, wherein the first gate dielectric and the second gate dielectric comprise $SiO_2$, and wherein the first gate dielectric is annealed with a first annealing treatment, and wherein the second gate dielectric is annealed with a second annealing treatment.

5. The semiconductor device of claim 4, wherein one or both of the first annealing treatment and the second annealing treatment are implemented in an $NH_3$ atmosphere, and wherein a first concentration of nitrogen at an outer surface of the first gate dielectric is different than a second concentration of nitrogen at an outer surface of the second gate dielectric.

6. The semiconductor device of claim 1, wherein one or both of the first gate dielectric and the second gate dielectric comprise a first layer and a second layer.

7. The semiconductor device of claim 6, wherein the first layer is an oxide material, and wherein the second layer is a dipole material.

8. The semiconductor device of claim 7, wherein the oxide material is $SiO_2$ or $HfO_2$, and wherein the dipole material is at least one of $La_2O_3$, $ZrO_2$, $Y_2O_3$, and $TiO_2$.

9. The semiconductor device of claim 1, wherein the first gate dielectric has a first thickness and the second gate dielectric has a second thickness, and wherein the first thickness and the second thickness are both greater than 3 nm.

10. The semiconductor device of claim 9, wherein the first thickness is different than the second thickness.

11. The semiconductor device of claim 10, wherein the first semiconductor channel and the second semiconductor channel are nanowires or nanoribbons.

12. A semiconductor device comprising:
a substrate;
a first gate all around (GAA) transistor over the substrate, the first GAA transistor comprising a first gate dielectric and a first gate electrode in contact with the first gate dielectric, wherein the first gate dielectric has a first thickness, the first GAA transistor having first semiconductor channel having a first vertical thickness and a first bottommost surface;
a second GAA transistor over the substrate, the second GAA transistor comprising a second gate dielectric and a second gate electrode in contact with the second gate dielectric, the second gate electrode having a same composition as the first gate electrode, wherein the second gate dielectric has a second thickness that is greater than the first thickness, and wherein the second GAA transistor is an N-type transistor, the second GAA transistor having second semiconductor channel having a second vertical thickness and a second bottommost surface, the second vertical thickness the same as the first vertical thickness, and the second bottommost surface at a same level as the first bottommost surface; and
a third GAA transistor over the substrate, the third GAA transistor comprising a third gate dielectric that is different than the second gate dielectric and the third GAA transistor comprising a third gate electrode having a same composition as the first and second gate electrodes, wherein the third gate dielectric has a third thickness that is greater than the first thickness, and wherein the third GAA transistor is a P-type transistor.

13. The semiconductor device of claim 12, wherein the first GAA transistor has a first channel length, and wherein the second GAA transistor and the third GAA transistor have a second channel length that is larger than the first channel length.

14. The semiconductor device of claim 12, wherein each of the first GAA transistor, the second GAA transistor, and the third GAA transistor comprise:

a plurality of semiconductor channels, wherein the semiconductor channels are oriented in a vertical stack.

15. The semiconductor device of claim 14, wherein a first spacing between semiconductor channels in the first GAA transistor is equal to a second spacing between semiconductor channels in the second GAA transistor and the third GAA transistor.

16. The semiconductor device of claim 15, wherein the first spacing is approximately 10 nm or less.

17. The semiconductor device of claim 16, wherein the first thickness is approximately 3 nm or less, and wherein the second thickness and the third thickness are approximately 3 nm or greater.

18. The semiconductor device of claim 12, wherein the second gate dielectric and the third gate dielectric comprise $SiO_2$, wherein an outer surface of the second gate dielectric has a first concentration of nitrogen, and wherein an outer surface of the third gate dielectric comprises a second concentration of nitrogen that is different than the first concentration of nitrogen.

19. The semiconductor device of claim 12, wherein one or both of the second gate dielectric and the third gate dielectric comprise a first layer and a second layer.

20. The semiconductor device of claim 19, wherein the first layer comprises $SiO_2$ or $HfO_2$, and wherein the second layer comprises at least one of $La_2O_3$, $ZrO_2$, $Y_2O_3$, and $TiO_2$.

* * * * *